United States Patent
Holt et al.

(10) Patent No.: US 6,448,797 B1
(45) Date of Patent: *Sep. 10, 2002

(54) METHOD AND APPARATUS AUTOMATED DOCKING OF A TEST HEAD TO A DEVICE HANDLER

(75) Inventors: Alyn R. Holt, Cherry Hill; Daniel J. Graham, Voorhees, both of NJ (US); I. Marvin Weilerstein, Jenkintown, PA (US); Christopher L. West, Vincentown, NJ (US)

(73) Assignee: inTest IP Corp., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/559,462

(22) Filed: Apr. 28, 2000

Related U.S. Application Data

(63) Continuation of application No. 08/828,893, filed on Mar. 31, 1997, now Pat. No. 6,057,695, which is a continuation-in-part of application No. 08/643,967, filed on May 7, 1996, now Pat. No. 5,900,737, which is a division of application No. 08/355,501, filed on Dec. 12, 1994, now Pat. No. 5,600,258, which is a continuation-in-part of application No. 08/122,055, filed on Sep. 15, 1993, now Pat. No. 5,440,943.

(51) Int. Cl.[7] .............................................. G01R 31/02
(52) U.S. Cl. ...................................... 324/758; 324/754
(58) Field of Search .............................. 324/158.1, 758, 324/754; 414/589, 590; 901/23, 24, 46, 408

(56) References Cited

U.S. PATENT DOCUMENTS 5,600,258 A * 2/1997 Holt et al. .................. 324/758
5,900,737 A * 5/1999 Graham et al. ............. 324/758

\* cited by examiner

*Primary Examiner*—Michael Sherry
*Assistant Examiner*—Paresh Patel
(74) *Attorney, Agent, or Firm*—RatnerPrestia

(57) ABSTRACT

A positioner facilitates docking and undocking of an electronic test head with a device handler. The positioner provides for rotation of the test head about a first axis. The positioner includes a support structure for moving the test head along a second axis orthogonal to the first axis. The support structure accurately docks the electronic test head with the device handler.

15 Claims, 39 Drawing Sheets

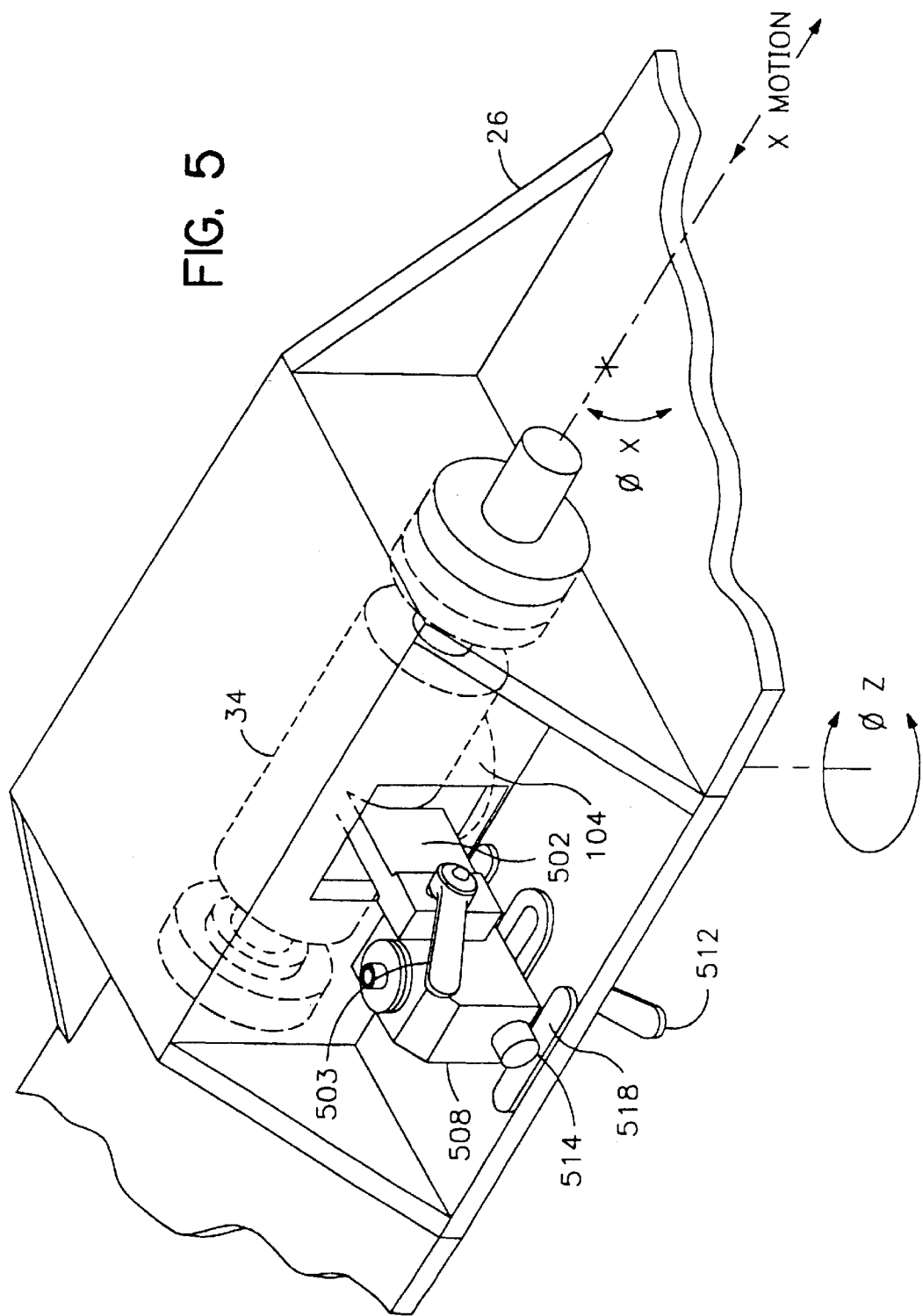

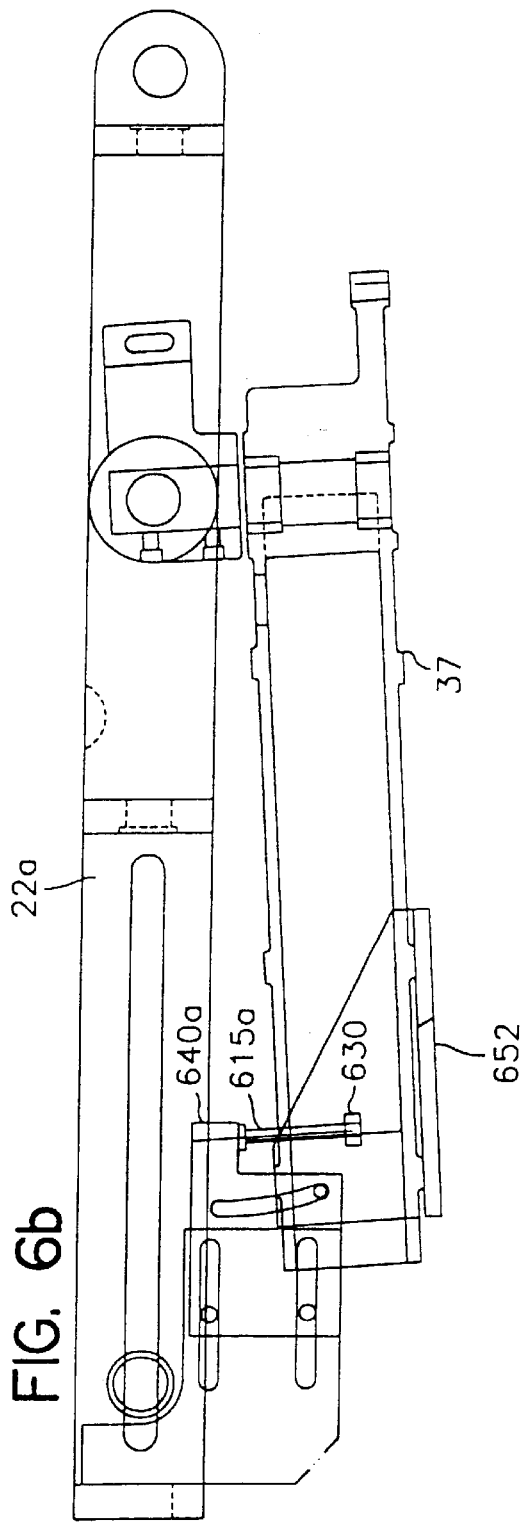
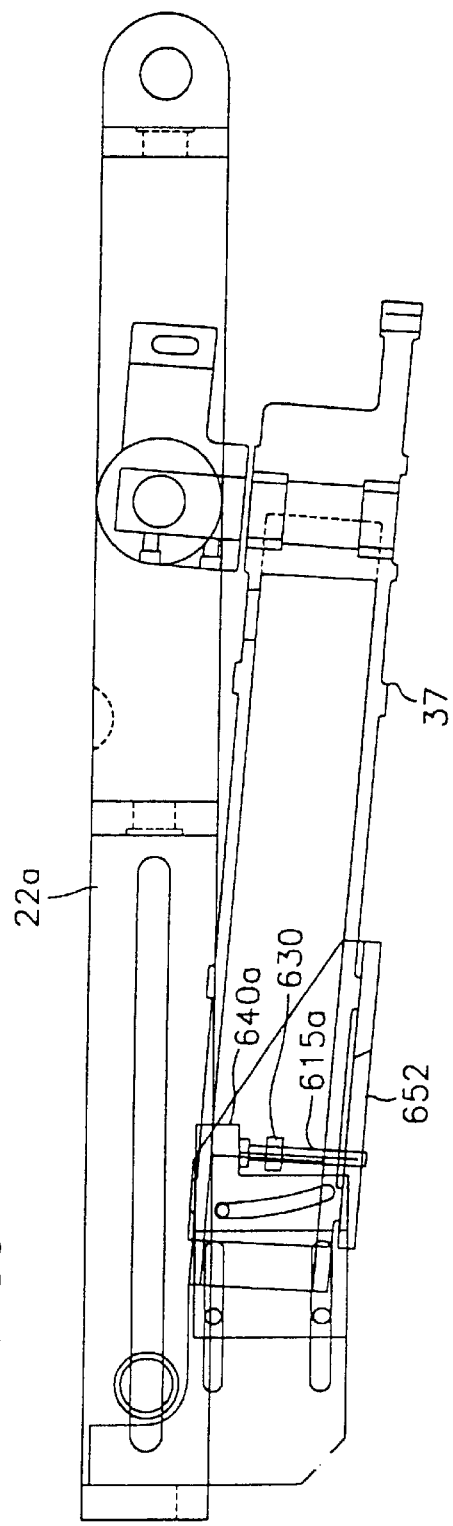

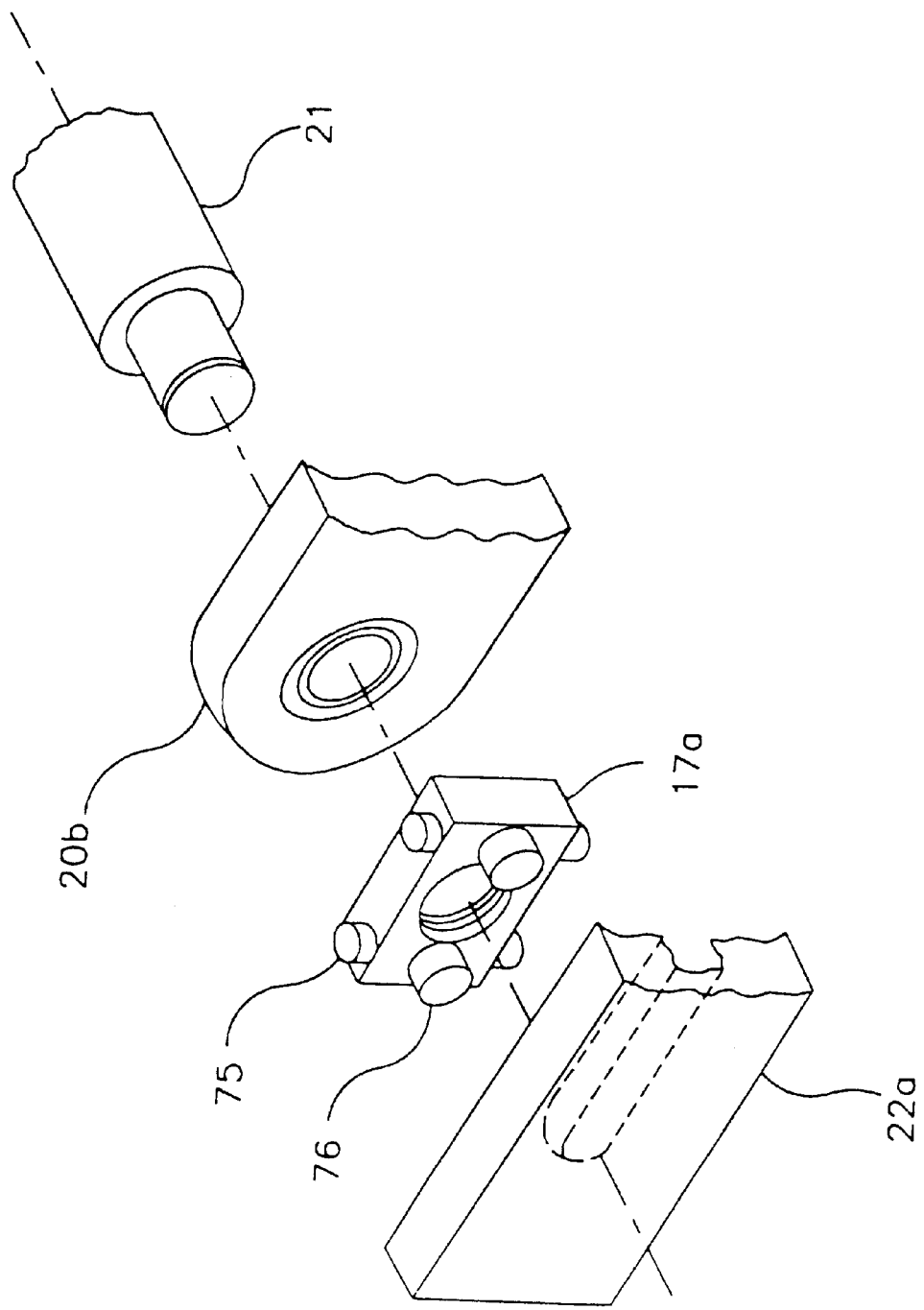

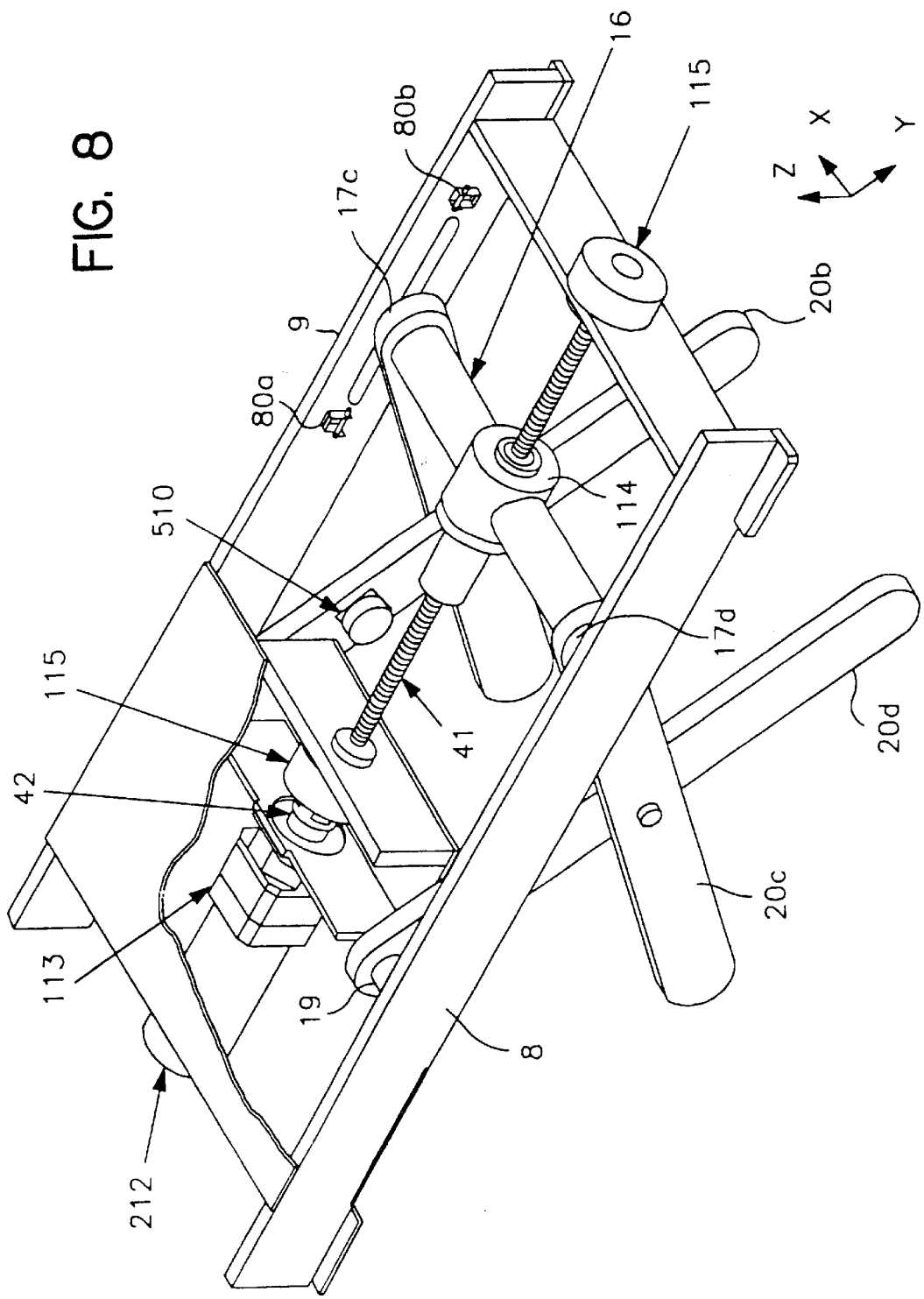

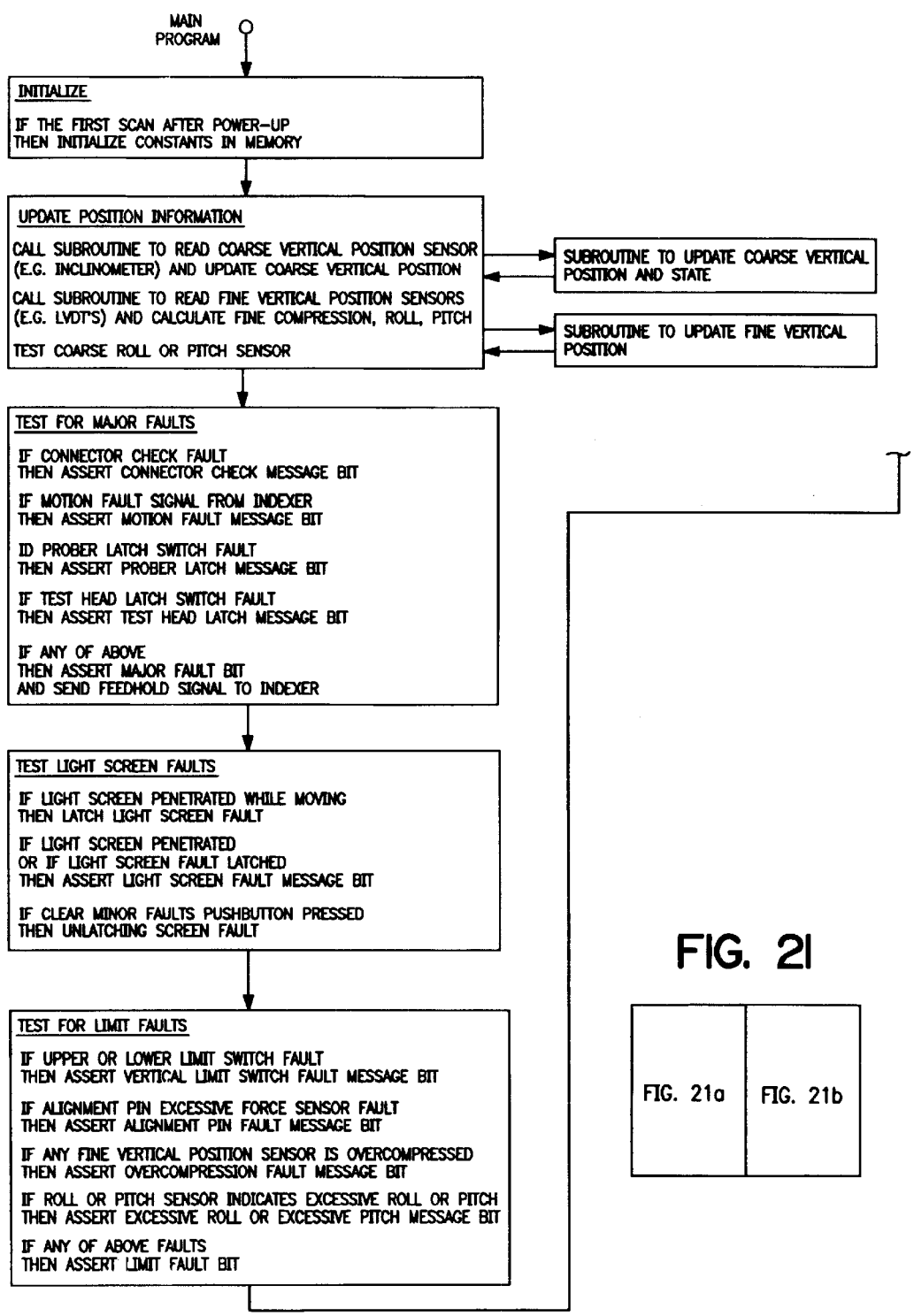
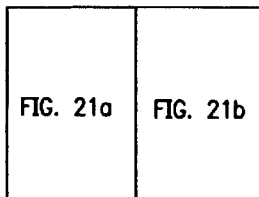
FIG. 21a

FIG. 29

MOVE DOWN SUBROUTINE 

( IF FIRST SCAN FOR MOVE DOWN PUSHBUTTON
OR FIRST SCAN FOR DOCK OPERATION)
AND
( IF VERTICAL STATE = 5
   THEN ISSUE VERTICAL MOVE DOWN, CONTINUOUS, SLOW
OR IF VERTICAL STATE = 4
   THEN ISSUE VERTICAL MOVE DOWN, CONTINUOUS, MEDIUM
OR IF VERTICAL STATE = 3
   THEN ISSUE VERTICAL MOVE DOWN, CONTINUOUS, FAST
OR IF VERTICAL STATE = 2
   THEN ISSUE VERTICAL MOVE, DOWN, CONTINUOUS, FAST)
OR IF VERTICAL STATE = 1
   THEN ISSUE VERTICAL MOVE, DOWN, CONTINUOUS, SLOW)

( IF NOT FIRST SCAN FOR MOVE UP PUSHBUTTON
OR NOT FIRST SCAN FOR DOCK OR UNDOCK OPERATION)
AND
( IF OLD VERTICAL STATE = 5 AND NEW STATE = 4
   THEN ISSUE VERTICAL MOVE DOWN, CONTINUOUS, MEDIUM
OR IF VERTICAL STATE = 4 AND NEW STATE = 3
   THEN ISSUE VERTICAL MOVE DOWN, CONTINUOUS, FAST
OR IF VERTICAL STATE = 3 AND NEW STATE = 2
   THEN ISSUE VERTICAL MOVE DOWN, CONTINUOUS, FAST
OR IF VERTICAL STATE = 2 AND NEW STATE = 1
   THEN ISSUE VERTICAL MOVE UP, CONTINUOUS, SLOW)

IF IN AUTOMATIC MOVE AND AT TAUGHT DOCK POSITION
OR IF NEW VERTICAL STATE = 0
   THEN ISSUE VERTICAL STOP

 RETURN

METHOD AND APPARATUS AUTOMATED DOCKING OF A TEST HEAD TO A DEVICE HANDLER

This application is a Continuation of 08/828,893 filed Mar. 31, 1997, now U.S. Pat. No. 6,057,695, (allowed) which is a Continuation-In-Part of 08/643,967 filed on May 7, 1996, now U.S. Pat. No. 5,900,737 which is a Divisional of 08/355,501 filed on Dec. 12, 1994, now U.S. Pat. No. 5,600,258 which is a Continuation-In-Part of 08/122,055 filed on Sep. 15, 1993, now U.S. Pat. No. 5,440,943.

FIELD OF THE INVENTION

This invention relates to the field of art of electronic test head positioners.

BACKGROUND OF THE INVENTION

In automatic testing of integrated circuits (IC) and other electronic devices, special device handlers have been used which brings the device to the proper temperature and places the device to be tested in position. The electronic testing itself is provided by a large and expensive automatic testing system which includes a test head which has been required to connect to and dock with the device handler. In such testing systems, the test head has usually been very heavy on the order of 40 to 400 kilograms. The reason for this weight is that the test head uses precision high frequency control and data signals so that the electronic circuits may be located as close as possible to the device under test. Accordingly, the test head has been densely packaged with electronic circuits in order to achieve accurate high speed testing of the sophisticated devices.

Test head positioner systems may be used to position the test head with respect to the device handler. When the test head is accurately in position with respect to the device handler, the test head and the device handler are said to be aligned. When the test head and device handler are aligned, the fragile test head and device handler electrical connectors can be brought together (i.e. docked), enabling the transfer of test signals between the test head and the device handler. Prior to docking, the fragile test head and device handler electrical connectors must be precisely aligned to avoid damaging the fragile electrical connectors.

As shown in U.S. Pat. Nos. 4,527,942 and 5,440,943, a positioner, able to move along a support structure, carries the test head to the desired location at which the test head is positioned to connect to and dock with the device handler. The test head is attached to the positioners so that the test head can achieve up to six degrees of freedom (X, Y, Z, θX, θY, θZ).

Test heads, and their respective positioners, are often used in an clean room environment. However, clean room environments are often extremely expensive to provide. Thus, the useable space within an ultraclean environment is only available at a premium.

A variety of test head manipulators are currently available for use in ultraclean room environments. Although some of these test head manipulators have a variety of desirable features, the amount of space which each of these test head manipulators requires for proper operation may be undesirable.

As device testing in general, and the use of test head and device handlers in particular, becomes developed to handle ever more increasingly complex tasks, test heads continue to become larger and larger. This increase relates both to the physical size and weight of the test head. However, as test heads get larger and larger, fully manual, fully balanced systems have become ever more difficult to design.

SUMMARY OF THE INVENTION

A positioner facilitates docking and undocking of an electronic test head with a device handler. The positioner provides for rotation of the test head about a first axis. The positioner includes a linkage arm structure for moving the test head along a second axis orthogonal to the first axis. Using motors, sensors and a processor, the linkage arm structure accurately docks the electronic test head with the device handler.

BRIEF DESCRIPTION OF THE DRAWINGS

FIG. 5 is a further perspective drawing which illustrates an exemplary embodiment of the present invention.

FIGS. 6b and 6c are side views of the cradle support shown in FIG. 6a.

FIG. 7b is an exploded perspective drawing which illustrates coupling between a linkage arm structure and a carriage rail.

FIG. 8 illustrates the Y-drive assemble according to an exemplary embodiment of the present invention.

FIGS. 21–29 are flow chart diagrams which explain operation of the processor system.

FIGS. 30–34 illustrate alternative embodiments of the present invention.

Overview

Figure 1:
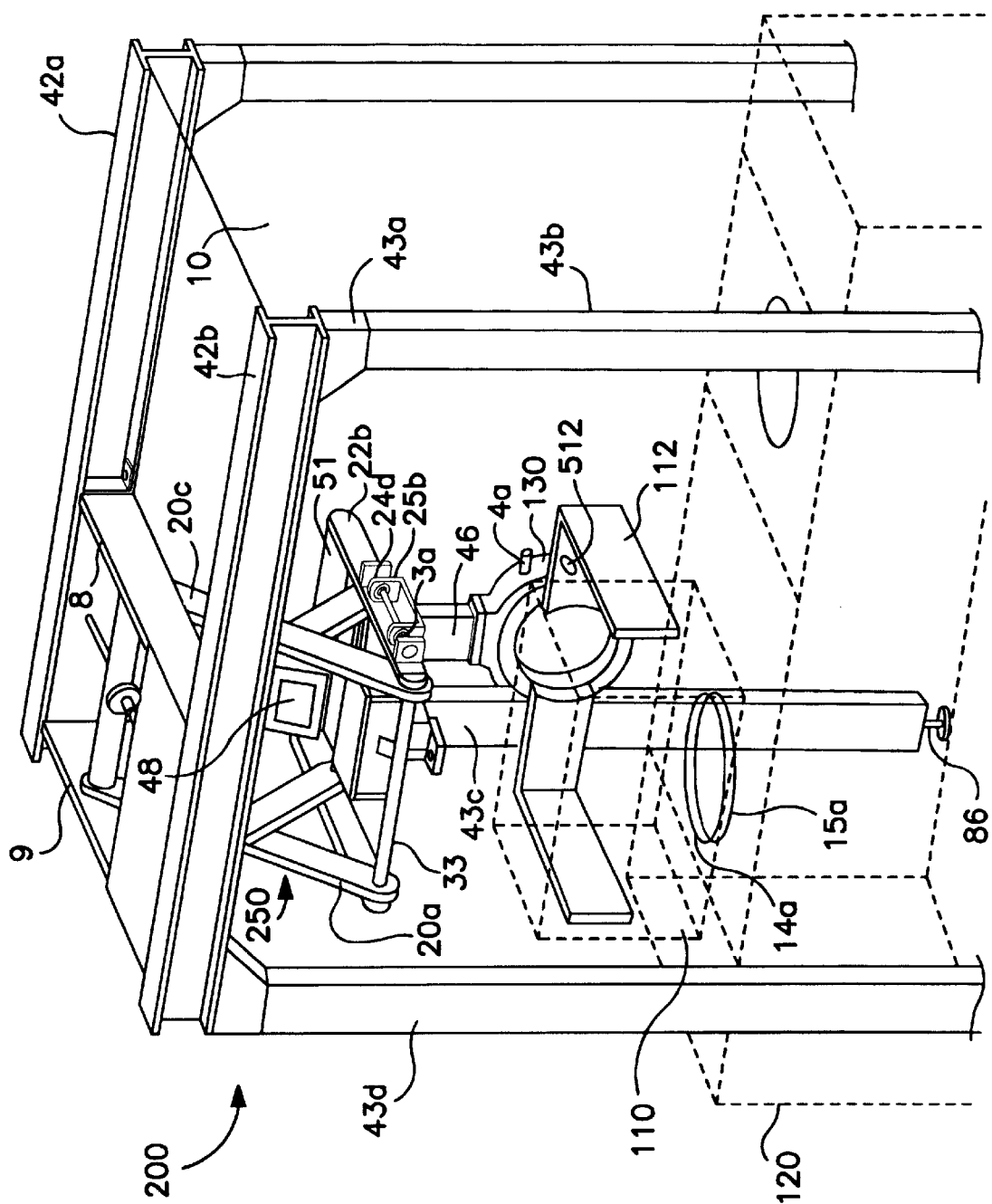
FIG. 1 is a perspective drawing which illustrates an exemplary embodiment of the present invention.

The present invention relates to a positioner system 200 for automatically docking an electronic test head 110 with respect to an integrated circuit handler 120. When test head 110 and device handler 120 are docked, the very fragile contacts (e.g. pins) 14 located on test head 110 are very precisely aligned and mated with connectors (e.g. pads) 15 on device handler 120. Alternately, fragile electrical contacts (not shown) (e.g. pins) on device handler 120 are mated with connectors (not shown) (e.g. pads) located on test head 110. Positioner system 200 moves the test head 110 under motor control with precise movements to mate contacts 14 and connectors 15. Furthermore, one or more positional sensors (described below) ensure that contacts 14 and connectors 15 are not misaligned prior to being mated.

Figure 4:
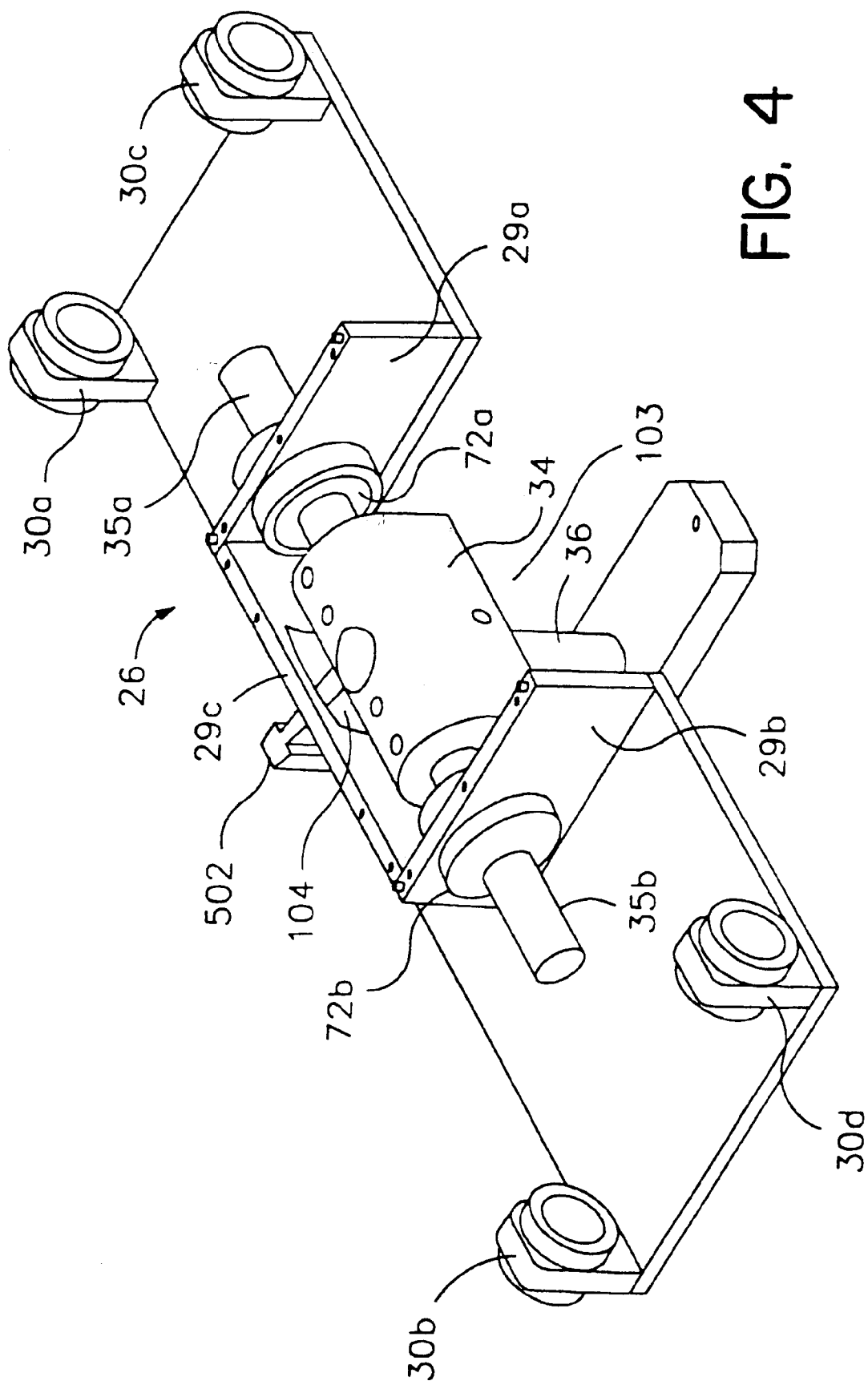
FIG. 4 is a perspective drawing which illustrates coupling between a swing arm and a carriage base.
Figure 7A:
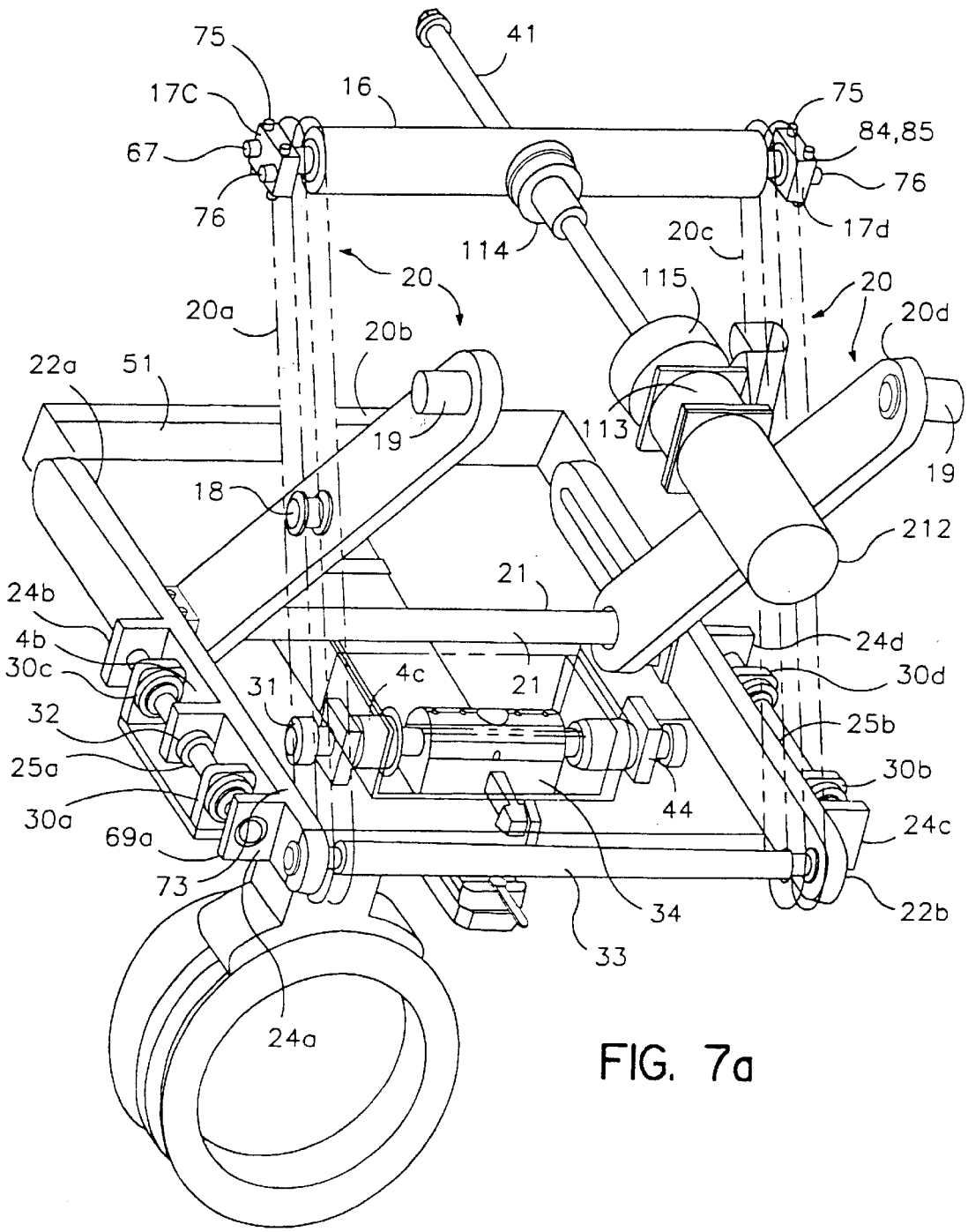
FIG. 7a is a perspective view of an exemplary embodiment of the present invention.
Figure 10:
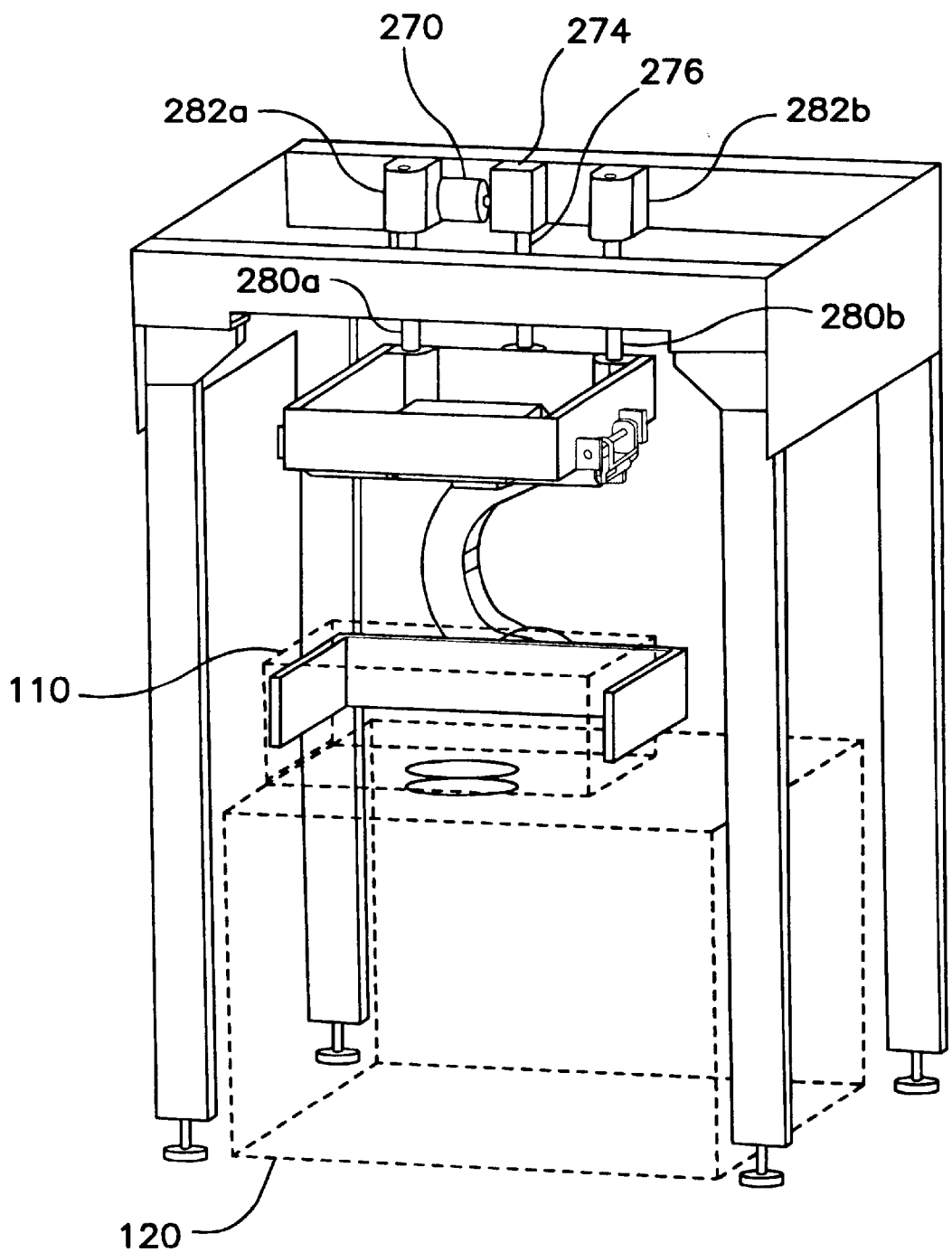
FIG. 10 is a perspective drawing which illustrates a further exemplary embodiment of the present invention.

As shown for example by FIG. 1, test head 110 (shown in phantom) is coupled to cradle 112. Inclinometer 512 provides signals which indicate the position of test head 110 about the Y axis (see FIG. 31). Cradle 112 is coupled to test head adapter ring 130 which rotates cradle 112 about the Y axis. Support member 46 couples test head drive assembly 130 to swing arm 37. Wrist shaft 36 extends through an opening in swing arm 37 and engages wrist block 34 (and enables movement about the Z axis). As shown in FIG. 4, side to side shafts 35a, b extend through openings in carriage base 26 to enable movement along and about the X axis. As shown in FIG. 7a, carriage base 26 slides along in-out shafts 25a, 25b for movement along the Y axis. In-out shafts 25a, 25b are coupled to carriage rails 22a, 22b. Carriage rails 22a, 22b form the bottom of vertical motion unit 250. Vertical motion unit enables vertical motion of test head 110. This may be accomplished using, for example linkage arms 20 which each form a scissor shaped member (FIG. 7a) or through other motorized means (FIGS. 10 and 11). As motor 212 rotates ball screw 41 (again FIG. 7a), the top portion of linkage arm structures 20a, 20c are moved either towards or away from the top portion of linkage arm structures 20b, 20d. This results in carriage rails 22a, b moving upward and downward as the bottoms of linkage arm structures 20 swing upward and downward (by virtue of the tops of linkage arm structures 20 moving towards and away from each other). Test head 110 is thus moved upward and downward.

Figure 12:
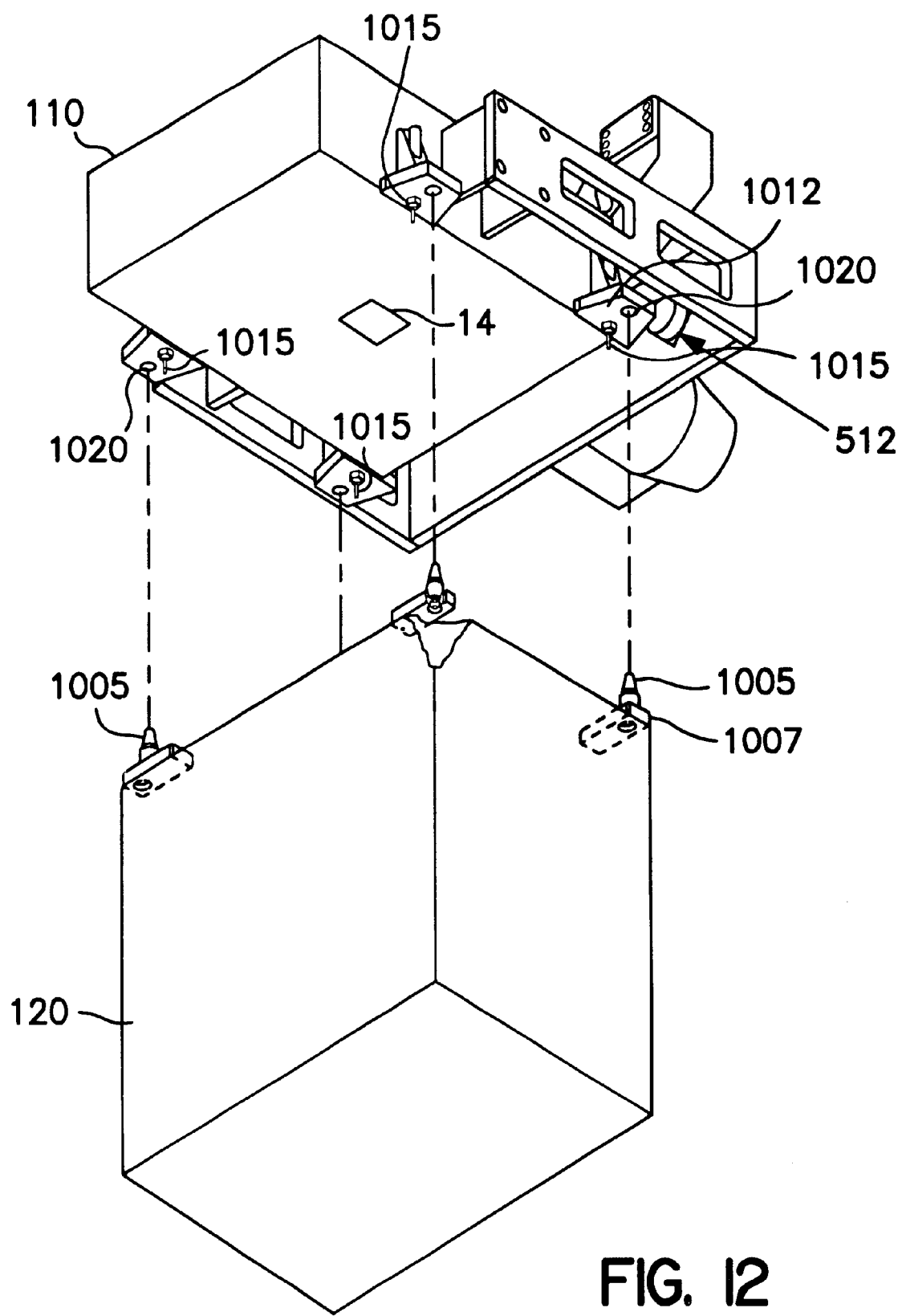
FIG. 12 is a perspective drawing which illustrates docking of a test head to a device handler in accordance with an exemplary embodiment of the present invention. The perspective drawing provides a view from the bottom of the test head and the device handler.

As shown in FIG. 12, protection plates 1012 are attached to test head 110. When alignment holes 1020 formed in protection plates 1012 receive alignment pins 1005 attached to device handler 120, test head 110 is properly aligned with device handler 120. Test head 110 and device handler 120 may then be docked without destroying contacts 14 included in test head 110.

As shown in FIG. 12, at least one Distance Sensor 1015 is also used (e.g., attached to or adjacent to test head 110 or device handler 120 or attached to protection plates 1012). Each Distance Sensor can be implemented using a variety of optical capacitive, inductive, or mechanical devices. Each Distance Sensor generates a signal indicating the distance between test head 110 and device handler 120. If, in accordance with preferred embodiments of the present invention, each Distance Sensor is a Linear Variable Distance Transducer or a Linear Potentiometer, then, as test head 110 is moved towards device handler 120, the sensory "pin" extending from each Distance Sensor is compressed inwards and each sensor generates a signal indicating the distance by which each sensory pin is compressed.

Figure 15:
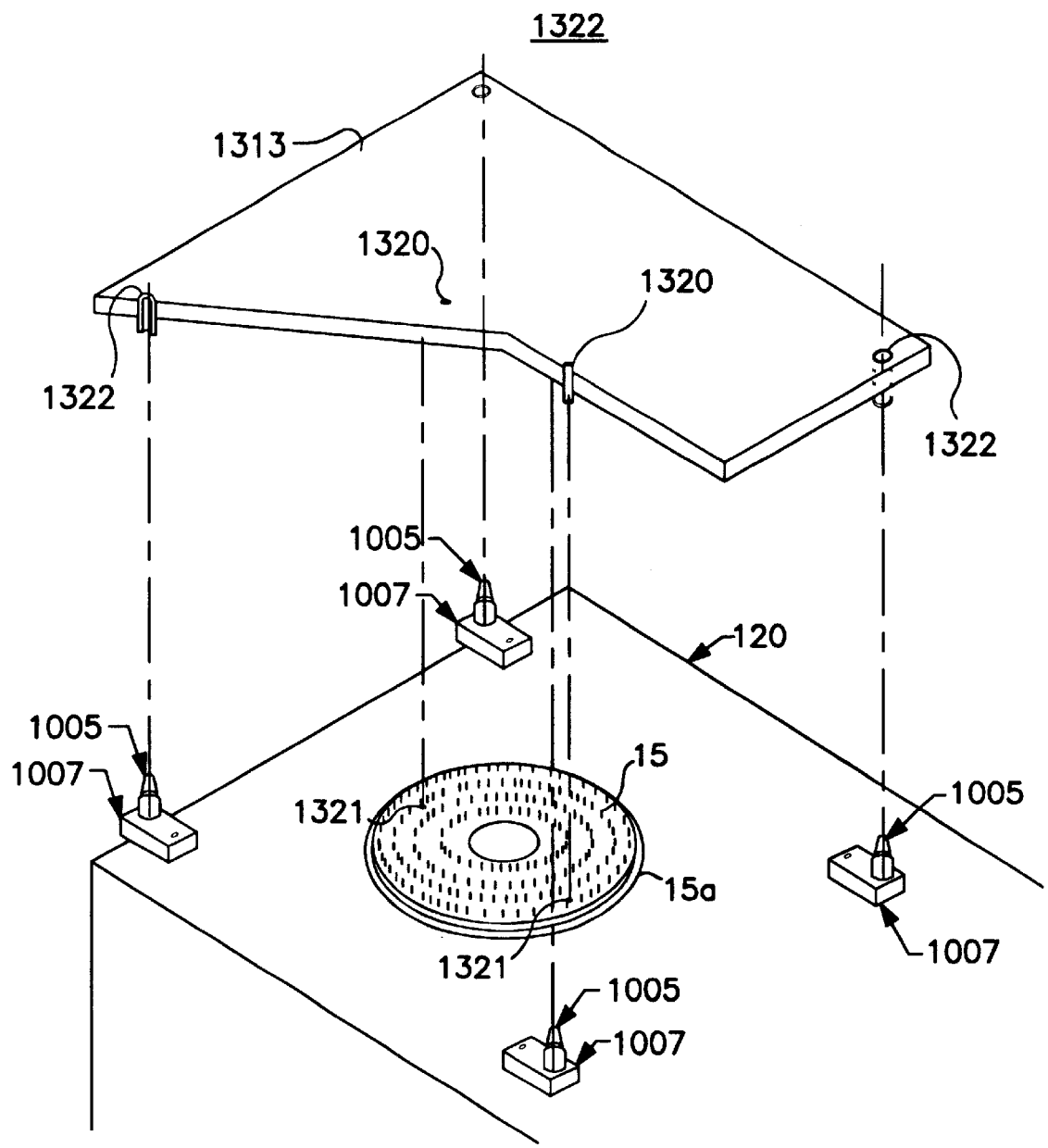
FIGS. 15 and 16 are perspective drawings which illustrate calibration of alignment structures with regard to the device handler and the test head, respectively.
Figure 16:
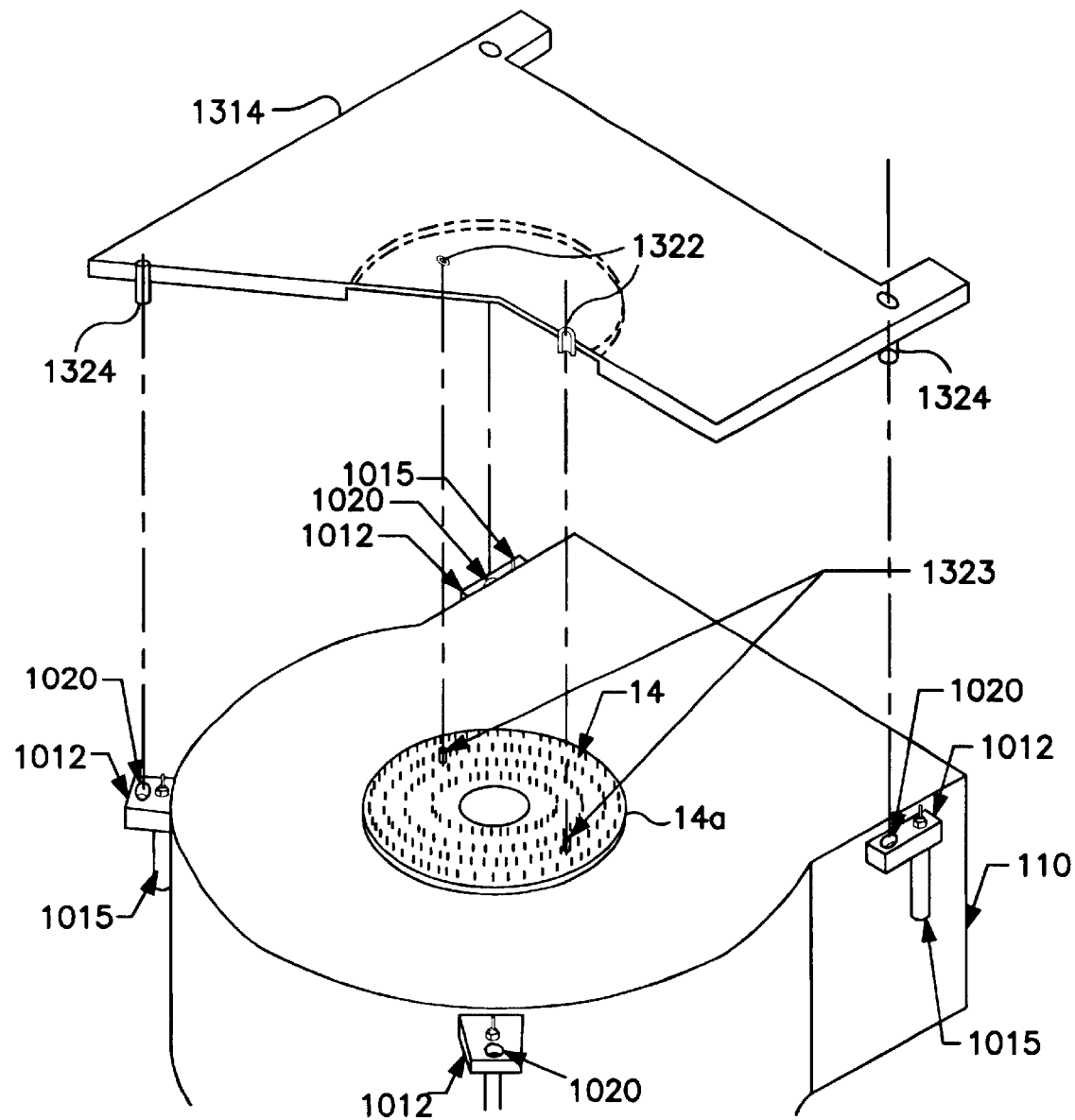

During installation (before test head 110 is ever docked to device handler 120) calibration fixtures 1313, 1314 (see FIGS. 15 and 16) are used to precisely align alignment pins 1005 and alignment holes 1020 with regard to each other and with regard to contacts 14 and connectors 15. Each calibration fixture is first positioned relative to a mechanical target on the respective test head 110 and device handler 120. Alignment pins 1005 and alignment holes are then positioned relative to alignment structures formed in the calibration fixtures. Each Distance Sensor is then situated so that each Distance Sensor's sensory pin is compressed inwards until each Distance Sensor provides a predetermined reading. This reading is defined to correspond to test head 10 and device handler 120 being relatively positioned to barely achieve contact between contacts 14 and connectors 15.

Test head 110 and device handler 120 are then brought together (i.e. using motorized or manual motion from positioner system 200) so that alignment holes 1020 receive alignment pins 1005 and each Distance Sensor generates the predetermined reading described above. Some (or all) of the non-motorized degrees of freedom of positioner system 200 are fixed. Test head 110 is then moved by motor towards device handler 120 a predetermined distance as indicated by the Distance Sensors to achieve, for example, desired insertion distance of contacts 14 in connectors 15 (or if contact 14 is a spring type pogo pin, desired distance of compression of contact 14). The signals generated by the Distance Sensors are then stored.

During automated motorized docking, the initial position of the test head is determined from the signals generated by inclinometers 510, 512. After test head 110 is lowered by motor (e.g., stepper motor) 212 so as to be close enough to device handler 120 for the Distance Sensors to register, the Distance Sensor signals are used to accurately determine the position of test head 110 relative to device handler 120. If test head 110 is then not properly aligned about the Y axis with device handler 120 prior to docking, the signals generated by the Distance Sensors will so indicate.

DETAILED DESCRIPTION OF THE INVENTION

Figure 35:
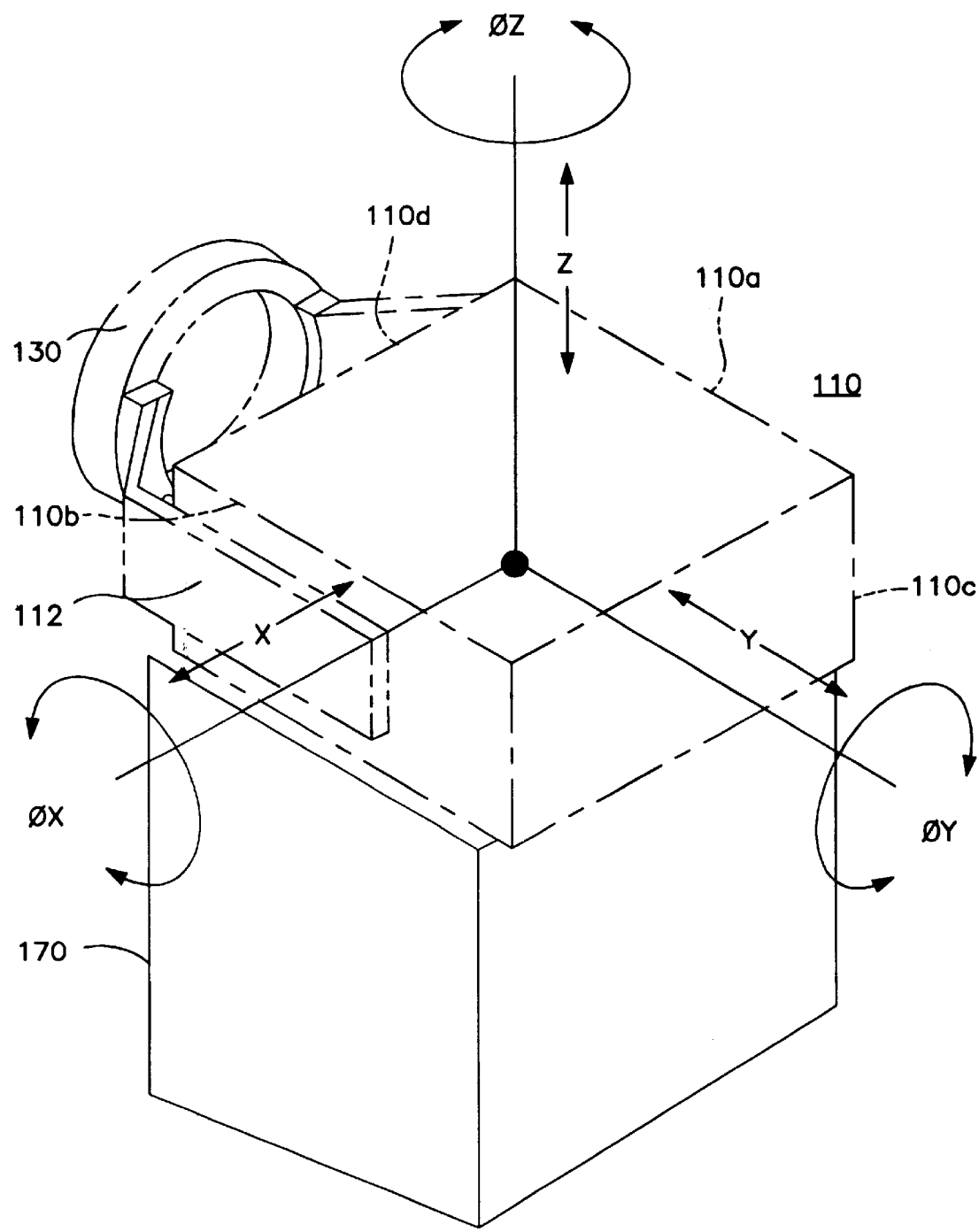
FIG. 35 diagrammatically shows the six degrees of freedom of the system shown for example in FIGS. 1, 7, 9, 10, 11a and 11b.

Referring now to FIG. 1, there is shown a test head positioner system 200 in accordance with an exemplary embodiment of the present invention. As shown, positioner system 200 carries a test head 110 with contacts 14 for a test system for docking with connectors (or contacts) 15 of an integrated device (circuit) handler 120. Contacts 14 may be pogo pins (collapsible, spring-like pins) or static pins (e.g., as in a Hypertac connector arrangement). Contacts 14 and connectors 15 each define a plane where contacts 14 and connectors 15 initially touch when they are in proper docking position. Each plane can be imagined as paper laying across the tops of contacts 14 and connectors 15. These contact planes will be referred to as the contact plane of test head 110 and the contact plane of device handler 120. It will be understood that other electronic devices may be handled by the device handler, such as transistors, chips or dies, etc. In operation, positioner system 200 moves test head 110 accurately and precisely so that it may be docked to handler 120. Docking may be accomplished, for example, as more fully described in a previous patent by Smith (U.S. Pat. No. 4,705,447), herein incorporated by reference, and in previous patents by Holt (U.S. Pat. Nos. 4,893,074 and 5,600,258), which are herein incorporated by reference. As will be described in detail, the position of test head 110 may be accurately manipulated to another position with six degrees of freedom X, Y, Z, θX, θY, θZ as shown in FIG. 35.

It is important for the proper installation of test head 110 that it have six degrees of freedom so that it can accurately be positioned with respect to handler 120. Furthermore, the motion of test head 110 can be restricted so that it automatically moves under motor control with only one degree of motion (for example θZ). In this manner, test head 110 can be readily undocked and redocked with handler 120, so that maintenance of test head 110 can be performed.

In an exemplary embodiment of the present invention, test head 110 may be mounted via a cradle (or yoke) 112 to test head adapter ring 130. By use of test head adapter ring 130, test head 110 is able to rotate at least 180° about an axis which shall be defined as a Y axis. The ability of test head 110 to rotate about the Y axis facilitates maintenance of test head 110 as will be more fully described below.

Figure 2:
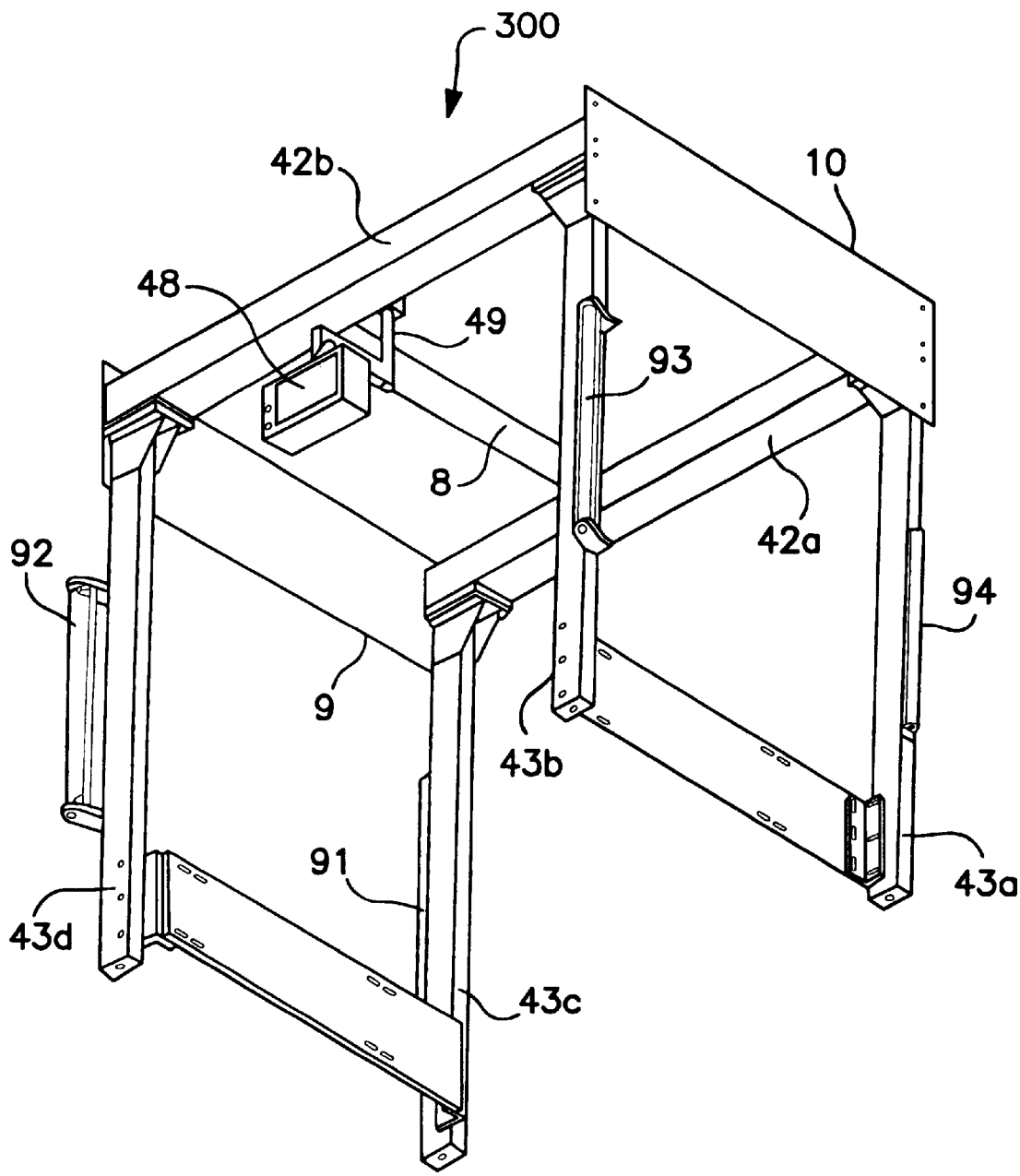
FIG. 2 is a perspective drawing which illustrates a gantry which forms a part of exemplary embodiments of the present invention. The perspective drawing provides a view from the bottom of the gantry.

Positioner assembly 200 includes a gantry 300, the details of which are shown in FIG. 2. There are provided two beams 42*a*, 42*b* and two carriage rails 9, 10 forming the top of the gantry. Two legs 43*b*, 43*d* are attached to beam 42*b* at opposite ends so as to support beam 42*b* a predetermined distance from the floor. In addition, two legs 43*a*, 43*c* are disposed at opposite ends of beam 42*a* to support beam 42*a* at a predetermined distance from the floor. At the bottom of each leg 43*a*, 43*b*, 43*c*, 43*d*, a leveling pad (not shown) may be installed to facilitate leveling of the gantry. Alternatively, the gantry (without, for example, legs) could be suspended from the ceiling over the integrated circuit handler 120. An operator terminal 48 is also included. In an exemplary embodiment of the present invention, operator terminal 48 is model 550 manufactured by Allen Bradley Corporation. The operator terminal is coupled to beam 42*b* by hanger assembly 49.

A light curtain assembly is also included. The light curtain assembly includes (infrared light) transmitter 91, mirror assemblies 92, 93 and receiver 94. When the light beams generated by transmitter 91 and received by receiver 94 are interrupted, all motorized functions are stopped. In this manner, risk of injury to a worker by the motorized system is reduced.

Figure 3:
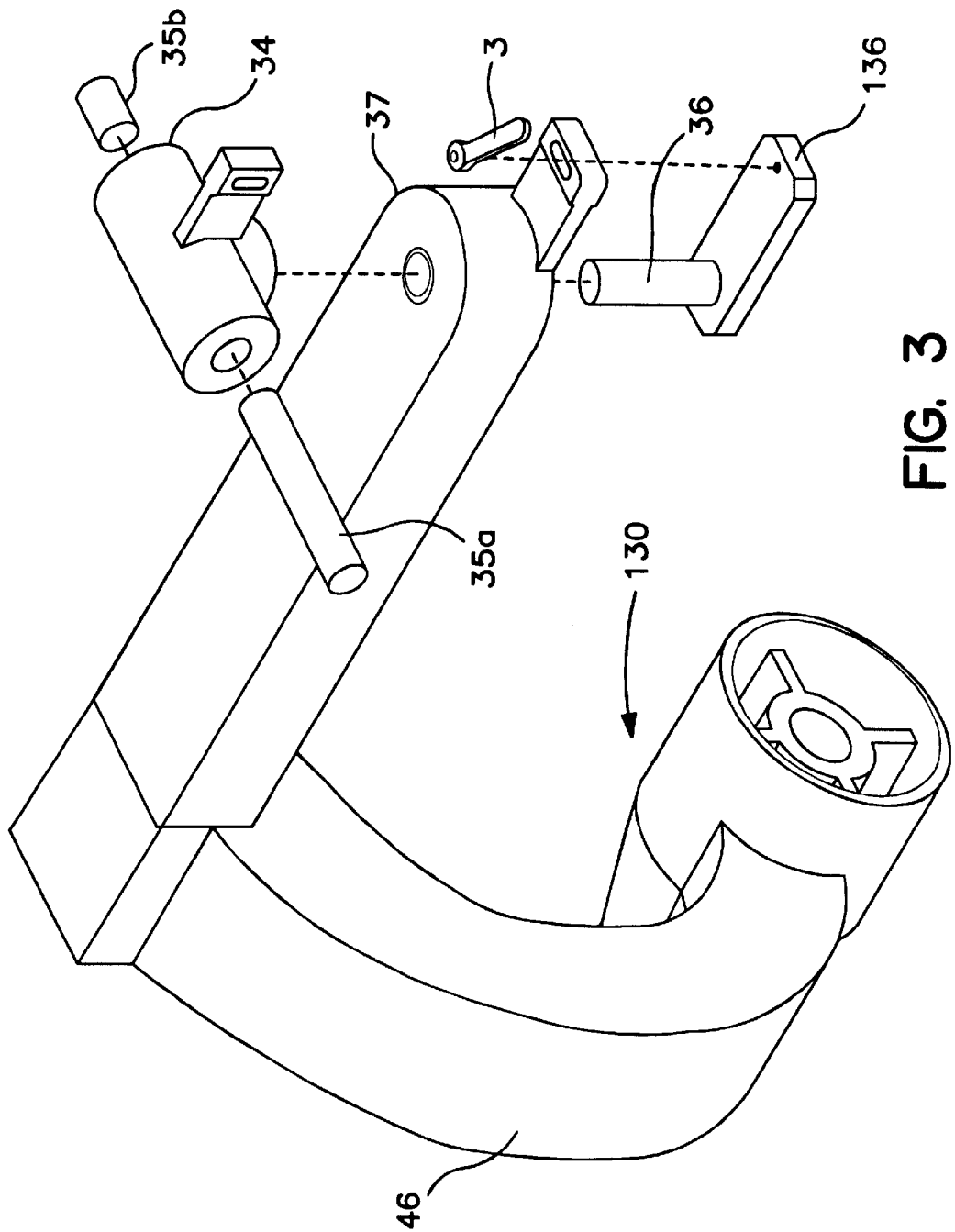
FIG. 3 is a perspective drawing which illustrates coupling between a cradle back (which provides roll motion) and a carriage base.

As shown in FIG. 3, test head adapter ring 130 is coupled to support member 46. Support member 46 may be, for example, a rectangular beam or a goose neck as shown in FIG. 3 (depending upon the path of cables leaving the test head). Support member 46 may be coupled, in turn, to swing arm 37. Swing arm 37 is desirably of proper length so that when test head 110 is coupled to positioner system, test head 110 is in a balanced state (i.e. at its approximate center of gravity) with regard to the other non-motorized degrees of freedom. Swing arm 37 is coupled to support member 46 at substantially right angles.

Test head adapter ring 130 is more fully described in U.S. Pat. No. 5,030,869 which is incorporated herein by reference.

Side-to-side shafts 35*a, b* are each coupled to wrist block 34 at respective openings. Thus, wrist block 34 is stationary relative to side-to-side shafts 35*a, b*. An additional opening is situated in the bottom of the wrist block 34. Wrist shaft 36 extends from the opening in the bottom of wrist block 34 through a further opening in swing arm 37. Wrist shaft 36 is coupled to wrist block 34. A flange 136 may be situated at the opposite end of wrist shaft 36 supporting swing arm 37. Wrist shaft 36 defines a Z axis. Swing arm 37 rotates about the Z axis by rotating relative to wrist shaft 36. Thrust bearing 80 (not shown), situated between the flange of wrist shaft 36 and swing arm 37 facilitates rotation of swing arm 37. Movement of swing arm 37 about the Z axis may be prevented by actuating lock wrench 3.

Wrist shaft 36 is coupled to carriage base 26. Coupling between wrist shaft 36 and carriage base 26 is illustrated by FIG. 4.

As shown in FIG. 4, carriage base 26 includes rectangular opening 103 and rectangular opening 104. Wrist shaft 36 extends between wrist block 34 and swing arm 37 by going through rectangular opening 103. Extension member 502 (extending from wrist block 34) extends through rectangular opening carriage walls 29*a*, 29*b*, 29*c*, 29*d* (not shown) which may be an integrally formed part of carriage base 26 are situated about rectangular opening 103. Carriage ceiling 29*e* (not shown) may be situated on top of carriage walls 29*a–d* to form a partially enclosed space. Side-to-side shaft 35*a* extends through carriage wall 29*a*. Similarly, side-to-side shaft 35*b* extends through carriage wall 29*b*.

Side-to-side shafts 35*a*, 35*b*, define an X axis. Thus, wrist block 34 is able to move along the X axis by the sliding motion of side-to-side shafts 35*a*, 35*b*. Wrist block 34 is also able to move about the X-axis defined by side-to-side shafts 35*a, b*. Movement of wrist block 34 both along and about the X-axis is facilitated by bearings 72*a*, 72*b* which may be situated, for example, adjacent to carriage walls 29*a*, 29*b* respectively.

As shown in FIG. 5, extension member 502 extends outwardly from wrist block 34. Extension member 502 extends through opening 104 and is coupled to lock collar 508. Lock screw 503 couples together extension member 502 and lock collar 508. As previously stated, test head 110 is capable of rotating about the X axis defined by side-to-side shafts 35*a*, 35*b*. Movement of test head 110 about the X axis may be prevented by actuating lock wrench 503.

Lock collar 508 is also used for preventing movement of test head 110 along the X axis. As previously stated, wrist block 34 is able to move along the X axis by side-to-side shafts 35*a*, 35*b*. Lock wrench 512 extends from the bottom of carriage base 26, through a slot formed in carriage base 26, and into lock collar 508. When lock wrench 512 is not actuated, movement of lock collar 508 with wrist block 34 (and hence test head 110) along the X axis is facilitated by cam follower 514 (which is mounted onto lock collar 508) sliding along cam follower receptacle 518 (which is mounted onto the top surface of carriage base 26). Movement of test head 110 along the X axis may be prevented by actuating lock wrench 512.

Figure 6A:
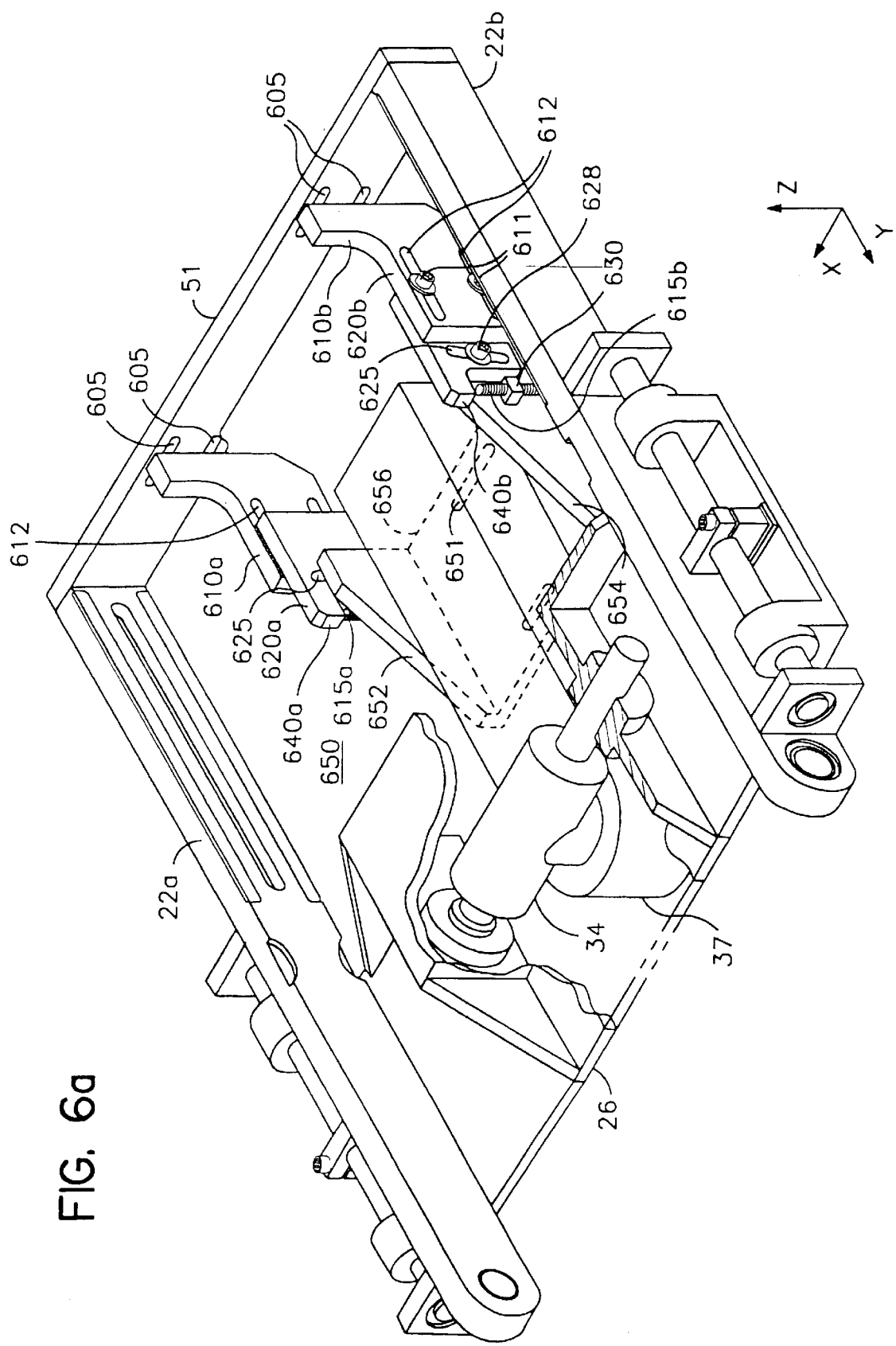
FIG. 6a is a perspective drawing which illustrates coupling between a swing arm support in accordance with a further exemplary embodiment of the present invention.

FIG. 6*a* illustrates an alternative embodiment of the present invention. Y translation lock brackets 610*a*, 610*b* are coupled to horizontal rail 51 through appropriate fasteners (not shown) which extend into Y translation lock brackets 610*a*, 610*b* through slots 605 formed in horizontal rail 51

(described in more detail with regard to FIG. 7a). Rear brackets 610a, 610b are capable of moving along respective slots 605 and are then fastened securely into place. θX lock bracket 620a is coupled to Y translation lock bracket 610a through an appropriate fastener (not shown) which extends into θX lock bracket 620a through slots 612 formed in Y translation lock bracket 610a. Similarly, θX lock bracket 620b is coupled to Y translation lock bracket 610b through fastener 628. θZ lock member 650 includes side portions 652, 654 and bottom portion 656. Side portion 652 is coupled to θX lock bracket 620a by fastener (not shown) which extends through a slot formed in θX lock bracket 620a. Side portion 654 is coupled to θX lock bracket 620b by fastener 628 which extends through a slot formed in θX lock bracket 620b. Swing arm 37 rests on bottom portion 656. Fasteners (not shown) extend from the bottom of bottom portion 656, through slots 651 in bottom portion 656 and into swing arm 37. Swing arm 37 is coupled to spindle block 34 and to the test head drive assembly 130 as described in the text which refers to FIG. 3.

Pitch adjust screws 615a, b extend through threaded openings in extension members 630 which are attached to and project from side portions 652, 654. The bottom end of pitch adjust screws 615a, b make contact with the bottom surfaces of projections 640a, b extending from θX lock brackets 620a, b.

The various components described above are capable of various types of movements relative to each other. These various movements cause swing arm 37 to move. The movement of swing arm 37 in turn causes test head 110 to move. In this manner, test head 110 can be aligned with device handler 120 for proper docking and undocking of test head 110 to device handler 120. For example, loosening bolts extending through openings 605 enables movement of test head 110 along the X axis. Loosening bolts 612 enables movement of test head 110 along the Y axis. Loosening bolts 630 and actuating pitch adjust screws 615a, b results in motion of test head 110 about the X axis (as shafts 35a, b pivot within bearings 72a, b). Loosening bolts extending through slots 651 and into swing arm 37 results in enabling motion of test head 110 about the Z axis (as swing arm 37 rotates about wrist shaft 36).

FIGS. 6b and 6c illustrate how swing arm 37 pivots about the X axis as pitch adjust screws 615a, b are actuated. FIG. 6b illustrates pitch adjust screw 615a extending as far as possible through extension member 630. Because of the relatively large distance between extension member 630 and the bottom surface of projection 640a, the rear of swing arm 37 tilts downwards and the front of swing arm 37 tilts upwards. Because test head 110 is coupled to the front portion swing arm 37, test head 110 tilts upwards (i.e., pivots upwards or counterclockwise to the position shown in FIG. 6b). FIG. 6c illustrates pitch adjust screw 615a extending as little as possible through extension member 630. Because of the relatively small distance between extension member 630 and the bottom surface of projection 640a, the rear of swing arm 37 tilts upwards and the front of the swing arm 37 tilts downwards. Test head 110 thus tilts downwards (i.e., pivots downwards or clockwise to the position shown in FIG. 6c).

As shown in FIG. 7a, bearing blocks 30a, 30b, 30c, 30d (included in carriage base 26) enables carriage base 26 to be coupled to carriage rails 22a, b. Specifically, pillow blocks 24a, b are coupled to carriage rail 22a by each extending from the surface of carriage rail 22a. Similarly, pillow blocks 24c, d are coupled to carriage rail 22b by each extending from the surface of carriage rail 22b. In-out shaft 25a extends from pillow block 24a to pillow block 24b and is held in position by retaining rings 69a, 69b (not shown). In-out shaft 25b extends from pillow block 24c to pillow block 24d and is held in position by retaining rings 69c, 69d (not shown). In-out shaft 25a extends through lock collar 32 which is also coupled to carriage base 26. Carriage rails 22a, 22b are coupled together by horizontal rail 51.

In-out shafts 25a, b each define a Y axis. Thus, carriage base 26 is capable of moving along the Y axis as a result of bearing blocks 30a, b, c, d sliding along in-out shafts 25a, b. The Y axis movement is facilitated by bearings 79 mounted in bearing blocks 30a, b, c, d. Movement of carriage base 26 along the Y axis may be prevented by actuating clamping knob 4b, shown coupled to lock collar 32.

As shown in FIG. 7a, linkage arm 20 (shown to the left in the figures) includes linkage arm structure 20a and linkage arm structure 20b. Linkage arm 20 (shown to the right in the figures) includes linkage arm structure 20c and linkage arm structure 20d. Linkage axle 33 includes ends of diminished diameter which extend through openings in linkage arm structures 20a, 20c and is coupled to carriage rails 22a, 22b. In this way, linkage arm structures 20a, 20c are coupled to carriage rails 22a, 22b.

Linkage axle 21 also includes ends of diminished diameter. This is more clearly shown in FIG. 7b. One end of linkage axle 21 extends through an opening near the bottom of arm component 20b, and through a further opening in trolley 17a. A similar configuration may be found on the opposite end of linkage axle 21 which extends through an opening in linkage arm structure 20d, and through an opening in a further trolley 17b (not shown). Each trolley 17a, b includes cam followers 76 which engage the slots in carriage rails 22a, b and thrust bearings 75 which make contact with carriage rails 22a, b. Cam followers 75, 76 facilitate movement of trolleys 17a, 17b relative to carriage rails 22a, b. As the left-most and right-most linkage arms function and are coupled to the remaining apparatus similarly, the operation of linkage arm structures 20a, 20b only will be described.

Linkage arm structure 20a and linkage arm structure 20b are coupled together by pivot pin 18. Movement of linkage arm structure 20a relative to linkage arm structure 20b is facilitated by needle bearing 84 (not shown).

Linkage arm structure 20a is capable of a limited amount of rotation about linkage axle 33. Furthermore, linkage arm structure 20b is capable of a limited amount of rotation about linkage axle 21. This rotation is useful for vertical motion of test head 110 along the z axis as will be described later.

As shown in FIG. 8, motor 212 is included. In an exemplary embodiment of the present invention, motor 212 is model M113-FF4011 manufactured by Superior Electric Corporation. Motor 212 rotates gear box 113. Rotation of gear box 113 may be selectively prevented by the actuation of brake 115. Gear box 113 rotates ball screw 41 (via shaft coupling 42). As ball screw 41 rotates, ball nut 114 moves along the axis defined by ball screw 41. Ball nut 114 is coupled to ball screw axle 16. As shown in FIG. 7a, ball screw axle 16 includes a shoulder at each end which projects through respective holes in linkage arm structures 20a, 20d and trolleys 17c, d. Trolleys 17c, d each include cam followers 76 which engage and move along respective tracks which are formed in carriage rail 9 and horizontal member 8 (shown in FIG. 1 between carriage rails 9, 10. Limit switches 80a, b mounted on the inner vertical surface of carriage rail 9 are used to detect whether trolley 17c has reached the track limits. Trolleys 17c, d each also include cam followers 75 which contact and facilitate movement relative to carriage rails 8, 9 as described below. Linkage arm structures 20b rotate about pivot pin 19. Each pivot pin 19 is fixed to horizontal member 8 and carriage rail 9, respectively. This rotation facilitates vertical movement of test head 110 along the z axis as described below.

Inclinometer 510 is attached to a vertical surface of linkage arm structure 20b. Inclinometer 512 is attached to a vertical surface of cradle (or yoke) 512 (see FIG. 1). In an exemplary embodiment of the present invention, inclinometers 510 and 512 are each Model A2-A-1, manufactured by U.S. Digital Corporation.

Vertical motion of test head 110 (i.e. motion at least substantially along the Z axis) is accomplished as follows. As motor 212 turns, ball screw 41 also turns. This results in motion of ball nut 114 along the axis defined by ball screw 41. As ball nut 114 moves along the axis defined by ball screw 41, ball screw axle 16 (through trolleys 17c, 17d with cam followers 76) moves along horizontal member 8 and carriage rail 9. This, in turn, results in the movement of the top portion of linkage arm structures 20a, 20c along horizontal member 8 and carriage rail 9. As the upper portions of linkage arm structures 20a, 20c move along horizontal member 8 and carriage rail 9, the bottom portion of linkage arm structures 20a, 20c also moves. This motion of the bottom portion of linkage arm structures 20a, 20c is vertical. The vertical motion of linkage arm structures 20a, 20c results in the vertical movement of carriage rails 22a, 22b. As the front portion of carriage rails 22a, 22b moves vertically, the rear portion of carriage rails 22a, 22b also moves vertically. As carriage rails 22a, 22b move vertically, test head 110 moves vertically as well. Thus, the linkage arm structures 20a, b, c, d provide a lifting mechanism while at the same time determining the path of motion of test head 110.

Figure 9:
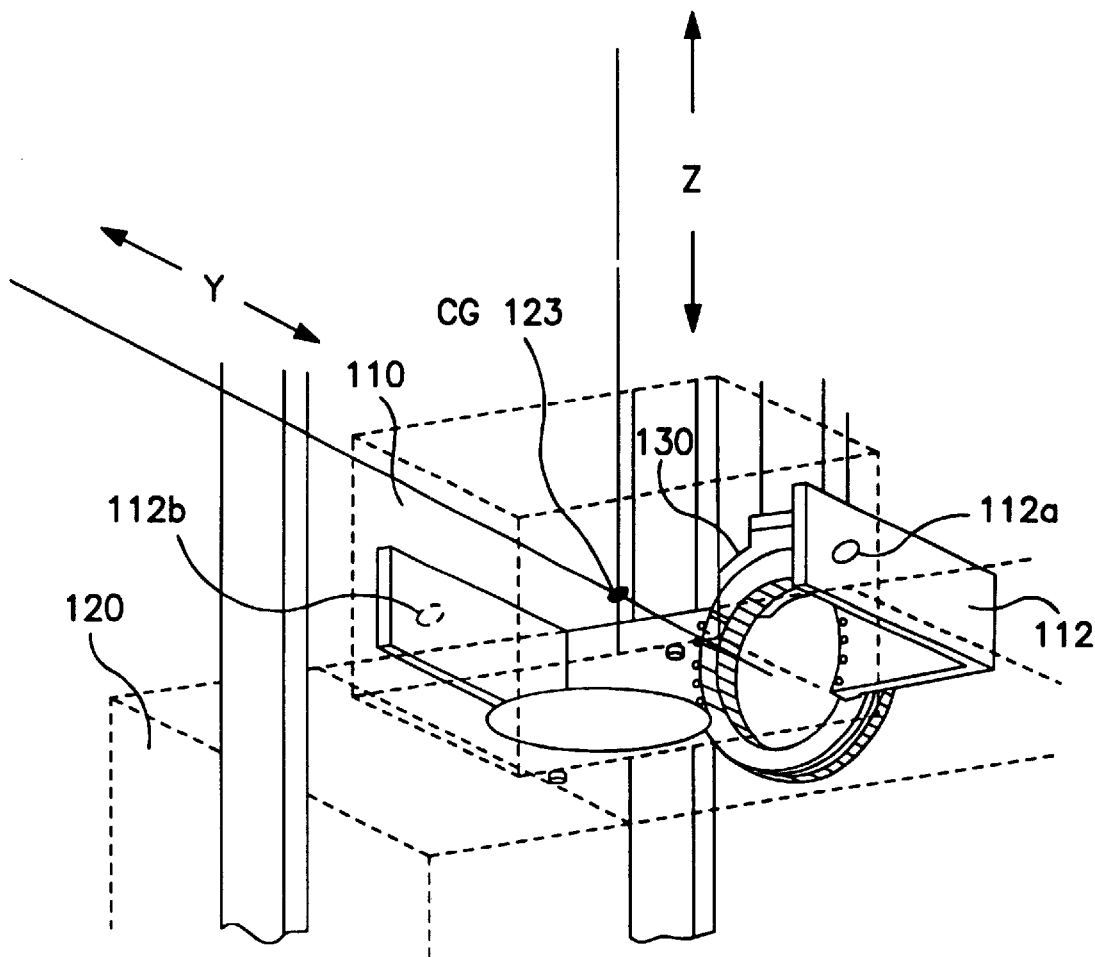
FIG. 9 is a perspective diagram which illustrates the coupling between the test head and a cradle.

Tilt of test head 110 (i.e., motion about the Y axis) is accomplished by rotation of test head adapter ring 130. As shown in FIG. 9, cradle (or yoke) 112 couples test head adapter ring 130 to test head 110. Test head adapter ring 130 rotates freely about the Y axis as described in U.S. Pat. No. 5,030,869. Yoke 112 may be bolted directly to test head 110. As test head adapter ring 130 rotates about the Y axis (which is orthogonal to the Z axis), cradle 112 rotates about the Y axis which, in turn, rotates test head 110 about the Y axis. In a preferred embodiment of the present invention, cradle 112 (at openings 112a, b) is bolted to test head 110 on opposite sides of test head 110 such that the center line of test head adapter ring 130 (θY axis about which test head 110 rotates) is at or near the center of gravity CG 123 of test head 110. More specifically, yoke 112 may be bolted to test head 110 (as shown) such that the center line of test head adapter ring 130 (θY axis about which test head 110 rotates) is at or above the center of gravity of test head 110. In this manner, if test head 110 is allowed to freely rotate about the Y axis by virtue of the rotation of test head adapter ring 130, test head 110 will be able to "self level" by gravity relative to the docking surface of device handler 120. The docking surface of test head 110 may be rotated, for example, so that it faces upward for performing maintenance after, of course, test head 110 has been moved away from device handler 120. When maintenance is completed, test head 110 may again be rotated so that its docking face is downwards, towards the docking surface of device handler 120 and test head 110 may be moved towards device handler 120. By attaching cradle 112 to test head 10 such that the center line of test head adapter ring (θY axis) is at or above the center of gravity of test head 110, test head 110 may "self level" so that its docking surface and the docking surface of device handler 120 become parallel. This is described in more detail below.

In other embodiments, test head 110 may pivot at the points where it is attached to cradle 112. In this manner, θX motion is obtained.

A further exemplary embodiment of the present invention is shown in FIG. 10. In FIG. 10, the scissor type members which were used to achieve vertical motion of the test head have been replaced with another means for moving the test head vertically. In the exemplary embodiment shown in FIG. 10, ball screw 276 is included. As motor 270 turns, ball screw 276 is rotated via right angle gear box 274. It will be understood by one of ordinary skill in the art that the torque from motor 270 can be transferred to ball screw 276 both directly (e.g., without right angle gear box 274) or indirectly using gear box 274 or some other apparatus to transfer torque to ball screw 276. It will also be understood that other means may be used to move test head 110 vertically. For example, pneumatic or hydraulic lift means may be used. A form of electromechanical lifting may also be used. Test head 110 need not be moved vertically using any particular structure as long as vertical movement is obtained.

Returning to the exemplary embodiment shown in FIG. 10, guide units 280a and 280b are included. These guide units move within apertures located within guides 282a and 282b.

Figure 11A:
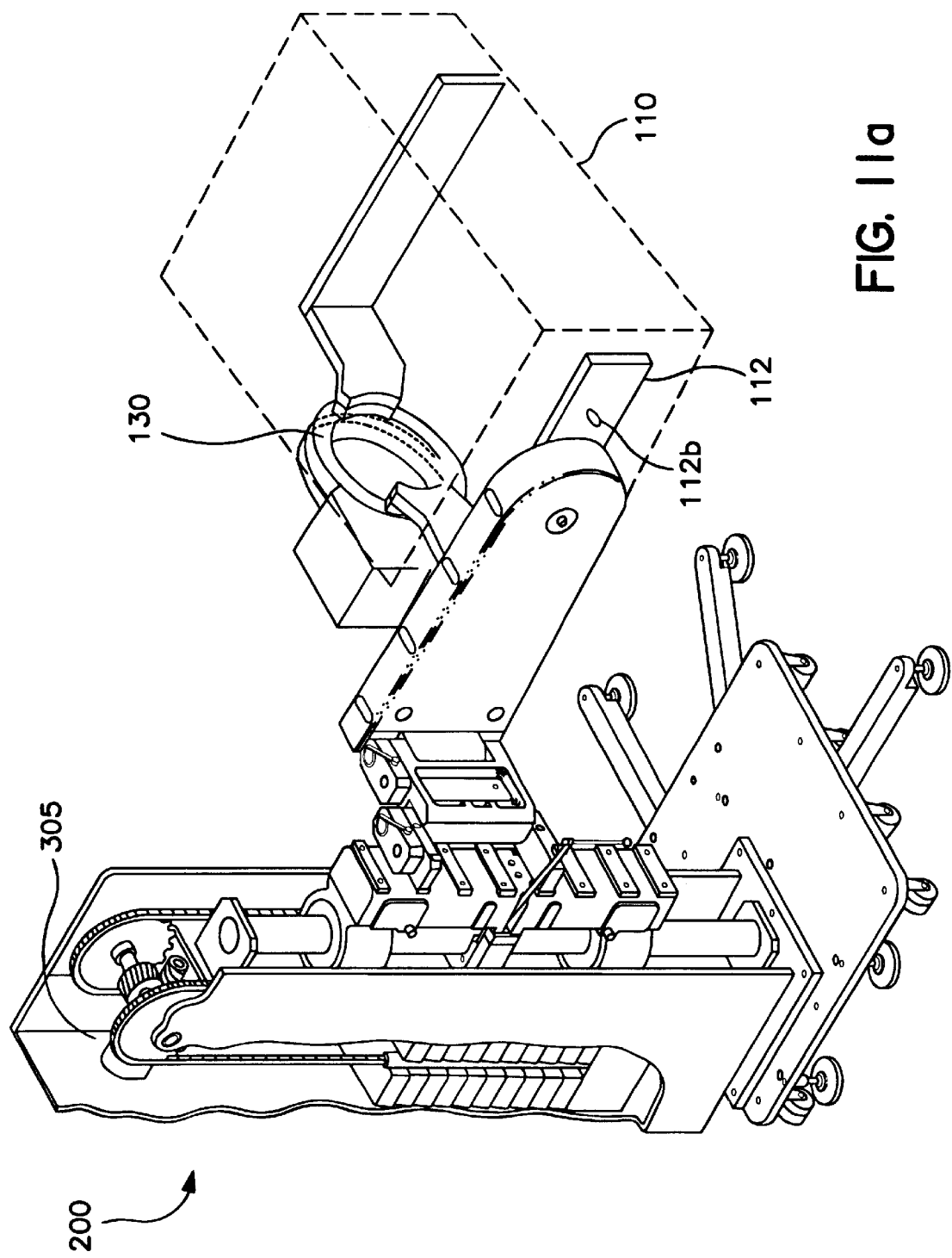
FIG. 11a is a perspective drawing which illustrates a further exemplary embodiment of the present invention.

A further exemplary embodiment of the present invention is shown in FIG. 11a. In this exemplary embodiment, alternative mechanical schemes are used to position test head 110 relative to device handler 120. The positioner system shown in FIG. 11a is very similar to the in 2 positioner system which is manufactured by in TEST Corporation of Cherry Hill, N.J. The positioner system shown in FIG. 11a differs from the in 2 positioner system in that a motor 305 is used to move test head 110 vertically. Test head adapter ring 130 is still included which may achieve manual rotation of test head 110 about the Y axis.

FIG. 11a shares similarities with the test head positioner systems which are described in U.S. Pat. No. 4,527,942 and U.S. Pat. No. 4,588,346 which are herein incorporated by reference. The positioner system shown in FIG. 11 differs from those positioner systems in that it has been modified to include a motor 305 for accomplishing motorized vertical motion. One of ordinary skill in the art could modify many other types of positioner systems to include a motor to accomplish motorized vertical motion. This could be accomplished, for example, by positioning a motor so that it engages (directly or indirectly) the cables or other devices which accomplish vertical lift. Exemplary test head positioner systems which could be modified to include a motor (or another form of powered—e.g., hydraulic or pneumatic—motion) are described in U.S. Pat. No. 4,705,447, U.S. Pat. No. 5,241,870 and U.S. Pat. No. 5,450,766 which are herein incorporated by reference.

Figure 11B:
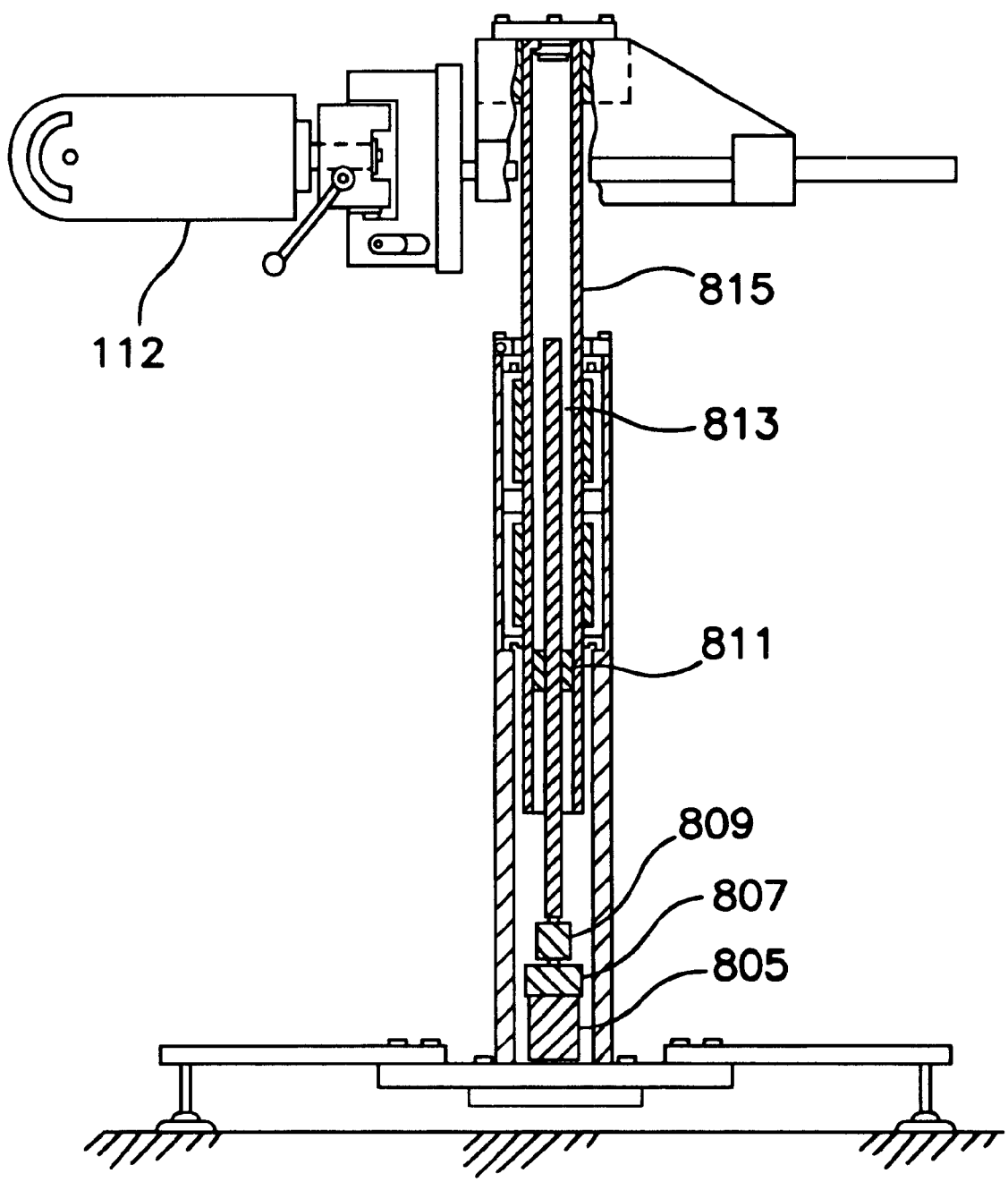
FIG. 11b is a perspective drawing which illustrates a further exemplary embodiment of the present invention.

A further exemplary embodiment of the present invention is shown in FIG. 11b. This embodiment shares similarities with the positioner system shown in U.S. Pat. No. 4,705,447. The pneumatic system, however, has been replaced with motor 805, gearbox 807, motor coupling 809, nut 811 and lead screw 813 in order to obtain vertical movement of the test head (not shown) which resides within cradle 112. Nut 811 is attached to and remains stationary relative to inner telescope 815. As lead screw 813 is rotated by motor 805, inner telescope 815 (and hence the test head) moves up and down by virtue of nut 811 moving up and down along lead screw 813.

Figure 13:
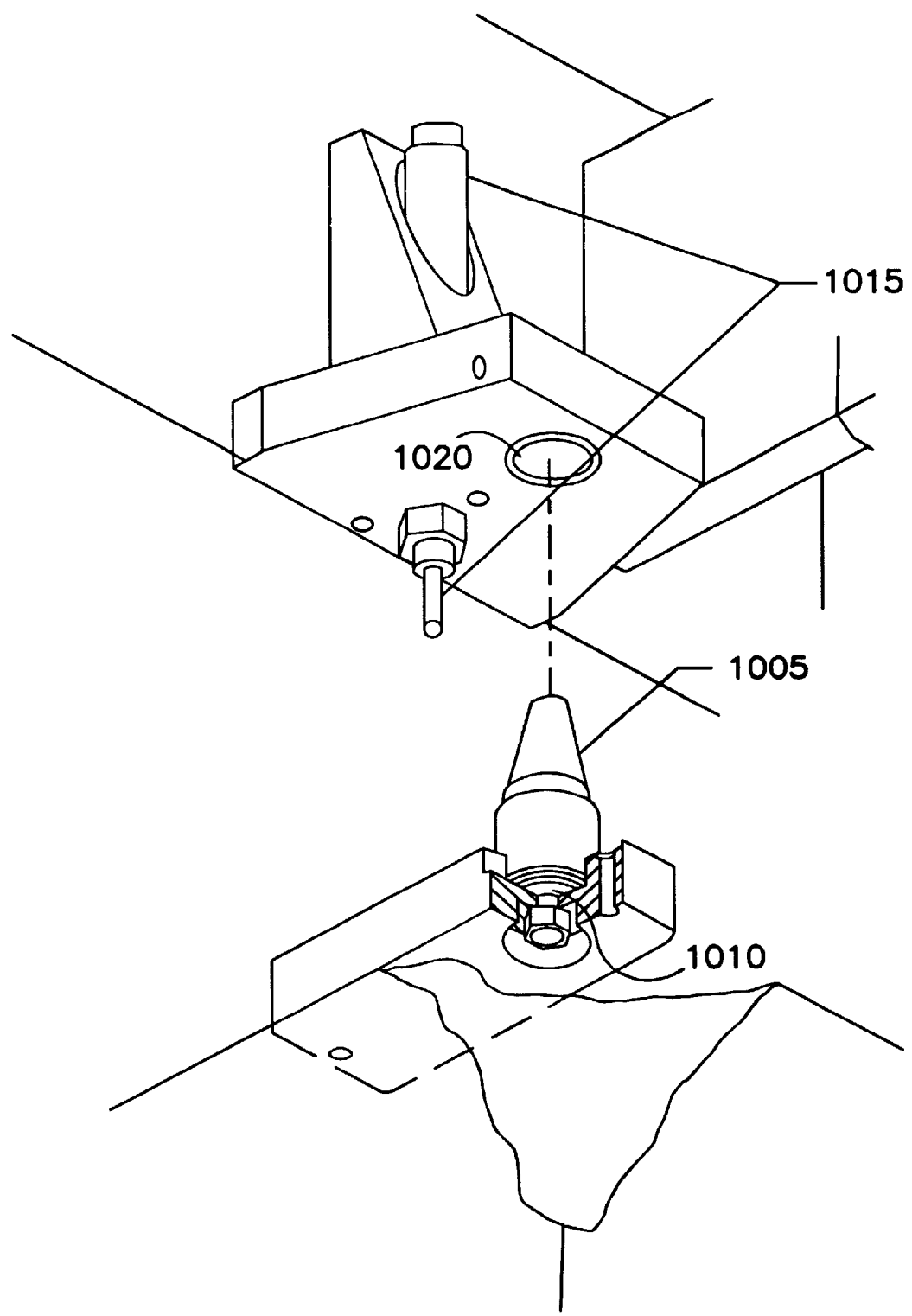
FIG. 13 is a perspective view which illustrates the expected path of docking of the alignment pin on the device handler to the alignment hole in the protection plate on the test head.

FIGS. 12 and 13 illustrate docking of test head 110 to device handler 120. As shown in FIG. 12, docking is accomplished by test head 110 being moved (for example, downward) toward device handler 120 so that fragile electrical contacts 14 (e.g., pogo pins) on test head 110 which are optionally aligned by alignment pins 1005 and alignment holes 1020 make precise contact with connectors 15 on device handler 120.

Plural alignment pin bases 1007 are mounted on device handler 120 (for example, on the top surface of device handler 120). A respective alignment pin 1005 is mounted on the top surface of each alignment pin base 1007. Each alignment pin 1005 has a tapered upper end.

Plural protection plates 1012 are mounted on test head 110 (for example, adjacent to the contact side surface of test head 110). Each protection plate 1012 includes respective alignment hole 1020 which mates with respective alignment pin 1005.

Directly below each alignment pin 1005 is located respective load cell 1010. In an exemplary embodiment of the present invention, load cell 1010 is model ELF-TC-1000-250 manufactured by Entran Corporation. If test head 110 is being accurately docked with device handler 120, each alignment pin 1005 will be centered relative to respective alignment hole 1020. If alignment pin 1005 is not centered relative to respective alignment hole 1020 (indicating that test head 110 is not accurately aligned to device handler 120) load cell 1010 will indicate a load during docking. Thus, although each load cell is not required to perform docking each load cell 1010 is provided as a safety precaution.

Alignment pin 1005 and load cell 1010 are thus used to determine whether there is misalignment between test head 110 and device handler 120 along the X or the Y axis. It is understood by one of ordinary skill in the art that other types of misalignment sensors may be used to determine whether there is proper alignment between test head 110 and device handler 120 along the X axis or the Y axis. For example, mechanical or optical devices can be used to determine the position of test head 110 relative to device handler 120 (or relative to some other predetermined position).

A respective Distance Sensor (DS) 1015 is also coupled to each protection plate 1012. Distance Sensors 1015 are labeled DS1, DS2, DS3 and DS4 for ease of identification. In an exemplary embodiment of the present invention, each Distance Sensor 1015 is a Linear Variable Distance Transducer model GCD-121-250 manufactured by Schaevitz Corporation. In a further exemplary embodiment of the present invention, a linear potentiometer (e.g., model 9605 manufactured by BEI Duncan Electronics Division) is used Any other device which measures distance between two objects may also be used. As each Distance Sensor 1015 makes contact with the respective alignment pin base 1007 and test head 110 is further lowered with respect to device handler 120, a spring loaded "pin" shown extending from the bottom of each Distance Sensor 1015 is pressed into the interior of Distance Sensor 1015. In other words, each Distance Sensor 1015 is compressed. As each Distance Sensor 1015 is compressed, each Distance Sensor 1015 generates a signal indicative of the distance by which each Distance Sensor 1015 is compressed (i.e. compression—distance). The distance by which each Distance Sensor 1015 is compressed provides an indication of the distance between test head 110 and device handler 120 to guide precise docking.

Figure 14A:
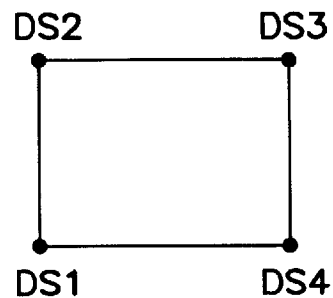
FIGS. 14A–E illustrate exemplary locations of sensors relative to the docking surface of the test head.

FIG. 12 shows four Distance Sensors being used. However, four Distance Sensors are not necessarily required. FIG. 14a shows four Distance Sensors situated about test head 110 in the configuration of FIG. 12. As shown in FIGS. 14b–14e, three, two, or even one sensor may be used to measure the distance between test head 110 and device handler 120. The use of Distance Sensors in each of the configuration illustrated by FIGS. 14a–14e will be more clearly described below.

During the course of initial mechanical installation and before the test head 110 and device handler 120 are docked for the first time (i.e. before any programming or "teaching" of the electronics to perform automated docking of test head 110 to device handler 120 and before actual automated docking of test head 110 to device handler 120 for the first time), device handler calibration fixture 1314 (shown in FIG. 15) and test head calibration fixture 1313 (shown in FIG. 16) are used to calibrate alignment pins 1005 relative to alignment holes 1020. In this way test head 110 and device handler 120 may be aligned to prevent damage to fragile contacts (or pogo pins) 14 during the docking procedure.

Device handler calibration fixture 1313 is used to properly position alignment pins 1005 relative to alignment holes 1020. In order to properly position alignment pins 1005, screws securing each alignment pin base 1007 to device handler 120 are loosened so that limited movement is possible between each alignment pin base 1007 and device handler 120. Device handler calibration fixture 1313 is then set on top of device handler 120. Device handler calibration fixture 1313 includes reference features 1320 (e.g. pins) which can be aligned to (or engage) reference features 1321 (e.g. openings) included in device handler 120. In this way, device handler calibration fixture 1313 is always identically positioned when it is set on top of the same device handler 120.

Device handler calibration fixture 1313 includes a plurality of calibration openings 1322. Each alignment pin base 1007 is moved so that each alignment pin 1005 precisely engages a respective calibration opening. Because of the tapered shape of each alignment pin 1005, if any alignment pin 1005 is not precisely positioned relative to the respective calibration opening 1322, load cell 1010 will indicate a load. Thus, the output of each load cell 1010 can be checked to ensure that each alignment pin 1005 is properly positioned. Once each alignment pin 1005 is properly positioned, the screws holding each alignment pin base 1007 are tightened, and device handler calibration fixture 1313 is removed.

Test head calibration fixture 1314 is used to properly position alignment holes 1020 relative to previously positioned alignment pins 1005. In order to properly position alignment holes 1020, test head 110 is rotated so that contacts 14 face upwards. The screws securing each protection plate 1012 to test head 110 are loosened so that limited movement is possible between each protection plate 1012 and test head 110. Test head calibration fixture 1314 is then set on top of test head 110. Test head calibration fixture 1314 includes reference features 1322 (e.g. openings) which can be aligned to (or be engaged by) reference features 1323 (e.g. pins) included in test head 110. In this way, test head calibration fixture 1314 is always identically positioned when it is set on top of test head 120.

Test head calibration fixture 1314 includes a plurality of calibration pins 1324 which correspond to the location of alignment pins 1005. Each protection plate 1012 is moved so that each alignment hole 1020 is precisely engaged by a respective calibration pin 1324. Once each protection plate 1012 is properly positioned, the screws holding each protection plate 1012 to test head 110 are tightened.

Once each protection plate 1012 is properly positioned, each Distance Sensor is calibrated relative to the top surface of contacts 14. This calibration is desirable to provide the electronics (e.g. processor system 1090, described below) with signals generated by each Distance Sensor 1015 which represent how far each Distance Sensor's spring loaded pin is pressed inward into each Distance Sensor when each Distance Sensor's spring loaded pin is at the same height as contacts 14. As previously described, contacts 14 may be, for example, pogo pins (collapsible, spring-like pins) or static pins (e.g., as in a Hypertac connector arrangement). Each Distance Sensor 1015 is physically moved upward or downward within protection plate 1012 and is then secured into place so that each Distance Sensor's spring loaded pin makes contact with the test head calibration fixture 1314 and is pressed inward into each Distance Sensor (e.g. by one tenth of an inch) so that each Distance Sensor's pin is in operating range within the Distance Sensor and each Distance Sensor begins to register. Thus, each Distance Sensor's spring loaded pin is aligned with the top of each of the pogo pins (in a non-compressed state). The signal generated by each Distance Sensor (corresponding to the amount by which each Distance Sensor's pin is pressed inwards) is then stored in the electronics (e.g. processor system 1090). This signal is defined as corresponding to the desirable inward compression of each Distance Sensor's pin instantaneously prior to mating of contacts with 14 to connectors 15 during docking of test head 110 to device handler 120. The test head calibration fixture 1314 is removed.

Again, other types of Distance Sensors without "pins" may also be used. Calibration of such distance sensors may be accomplished similarly to the description provided above and would be apparent from the above description to one of ordinary skill in the art.

Because calibration pins 1324 and calibration openings 1322 are formed in corresponding positions in calibration fixtures 1313, 1314, the calibration procedure set forth above results in alignment pins 1007 and alignment holes 1020 relatively coinciding to facilitate accurate docking of contacts 14 and connectors 15.

Once alignment pins 1007 and alignment holes 1020 are properly positioned, the various lock screws included in positioner system 200 are loosened so that positioner system 200 may move test head 110 with six degrees of motion (X, Y, Z, θX, θY, θZ) so that alignment holes 1020 on test head 10 are engaged by alignment pins 1005 on device handler 120. Motion in the Z direction is accomplished by actuating motor 212 (shown in FIG. 7*a*). Motion in the θY direction is accomplished by manually rotating test head adapter ring 131. Motion in the θX direction is accomplished by loosening lock screw 503 (or loosening lock screws 628 and turning pitch adjust screws 615*a*, *b*). Motion in the X direction is accomplished by loosening lock screw 512 (or loosening lock screws coupled to horizontal rail 51). Motion in the Y direction is accomplished by loosening lock handle 4*b*. Motion in the θZ direction is accomplished by loosening lock handle 3 (or loosening the screws going through slots 651).

After installation has been completed, movement of the test head 110 in four degrees of motion (i.e. the non-motorized degrees of motion) will be restricted until a new installation (i.e., change in alignment between test head 110 and device handler 120) is required. In this manner, accurate docking between test head 110 and device handler 120 when test head 110 is in actual operating use is accomplished under motor control as provided by motor 212. In this manner, as explained below, fully automated docking of test head 110 to device handler 120 is obtained.

Misalignment during automated docking between test head 110 and device handler 120 will result in misalignment between alignment hole 1020 and respective alignment pin 1005. Misalignment between alignment hole 1020 and respective alignment pin 1005, as previously explained, will result in load detection from load cell 1010. Thus, the detection of load from load cell 1010 indicates misalignment between test head 10 and device handler 120 and docking can be aborted until the cause of the misalignment is repaired.

Figure 17:
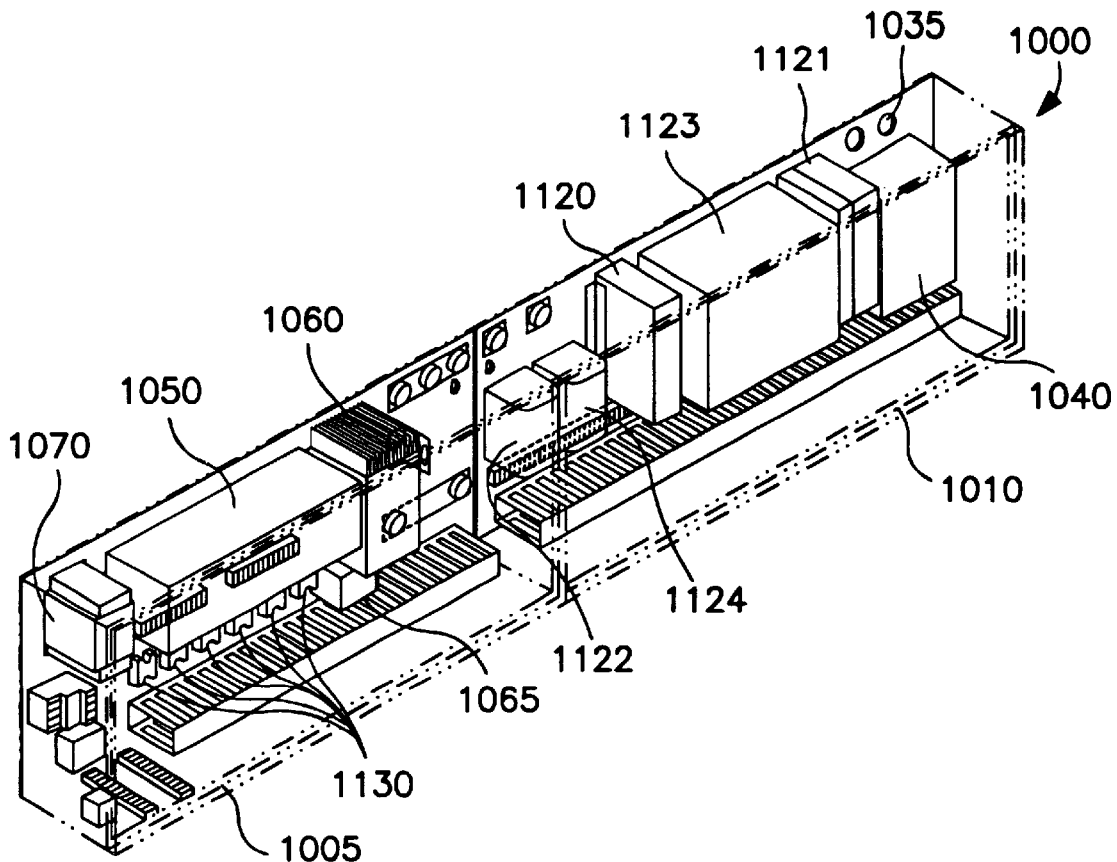
FIG. 17 is a perspective view of the enclosure which contains the electronic components for docking the test head with the device handler in accordance with an exemplary embodiment of the present invention.

FIG. 17 is a perspective drawing which shows the electronics cabinet 1000 with its various electrical components which enable the automated docking of test head 110 to device handler 120. Relays 1122, 1124 actuate the various motors. Step up auto transformer 1070 converts 115 volt AC to 230 volt AC (for use, again, by the motors—alternatively, if there is 230 volt AC service a step down transformer may be included to provide 115 volt AC). Power supply 1060 provides a 24 volt DC output. This 24 volt DC output is used for powering limit switches 80*a*, *b* (on horizontal member 8), limit switch 135 (on the roll axis), a switch (not shown) on device handler 120, a switch (not shown) on the test head, brakes 115, 131 and a relay contact in the light screen. Driver 1121 is used for driving stepper motor 132. Driver 1123 is used for driving stepper motor 212. Power supply 1065 is used for powering Distance Sensor 1015, load cell 1010, inclinometer 512, and inclinometer 510.

Figure 18:
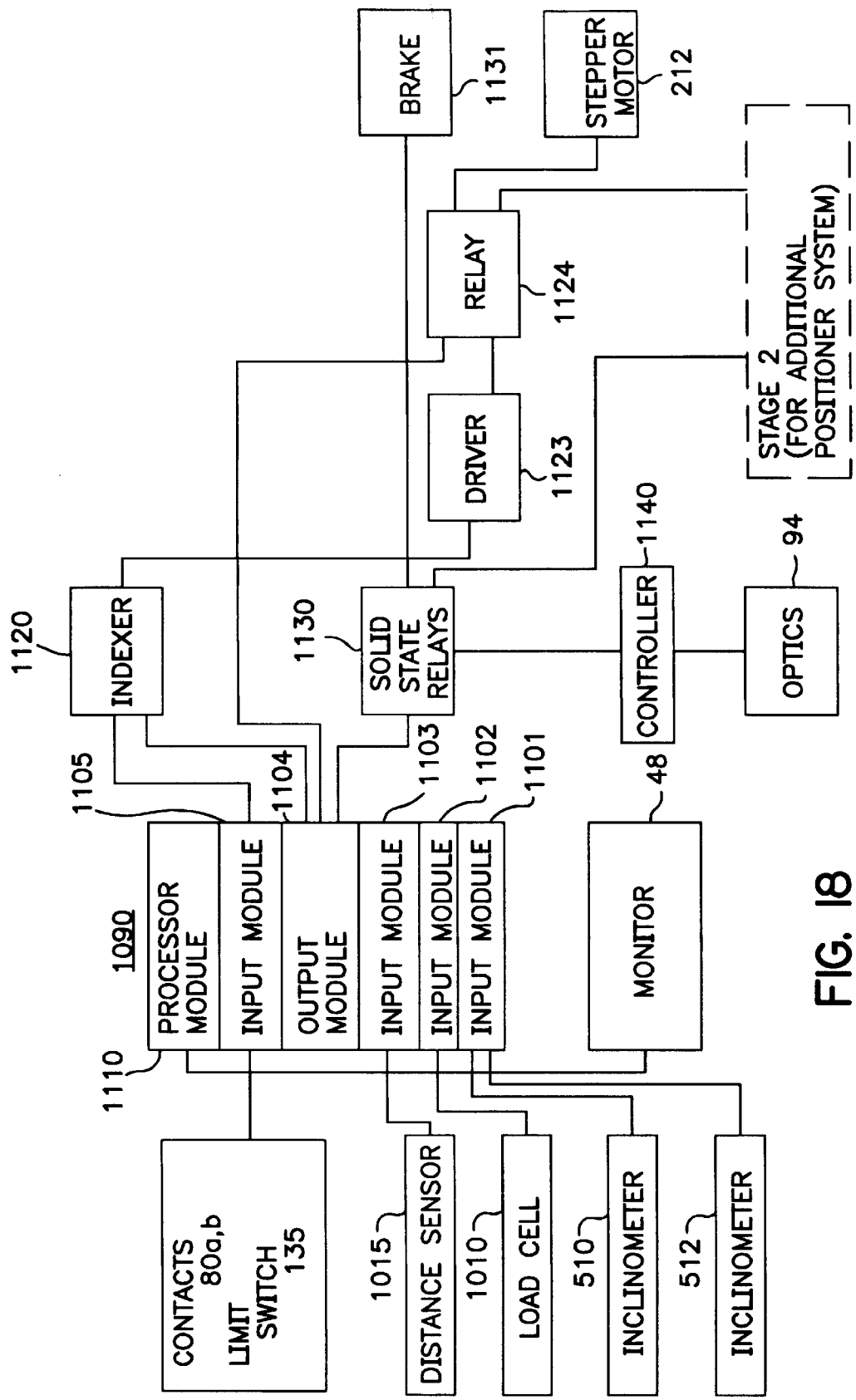
FIG. 18 is a block diagram which illustrates the operation of the electronic components included in an exemplary embodiment of the present invention.

The inter-relationship with the various electrical components shown in FIG. 17 is more clearly illustrated by FIG. 18. As shown in FIG. 18, processor system 1090 includes processor module 1110 (e.g., model SLC5/03 manufactured by Allen Bradley Corporation), input module 1101, input module 1102, input module 1103, output module 1104, and input module 1105 (e.g. all also manufactured by Allen Bradley Corporation). Input module 1101 receives input signals from inclinometers 510 and 512. Input module 1102 receives input signals from load cell 1010. Input module 1103 receives input signals from Distance Sensor 1015. Monitor 48 (also shown in FIG. 2) is also included. Processor module 1110 receives input data from, and transmits display data to, monitor 48. Input module 1105 receives input data from contacts 80*a*, *b* and limit switch 135. Output module 1104 transmits signals to indexer 1120. Indexer 1120 transmits signals to driver 1123 which results in actuation of stepper motor 212. Output module 1104 transmits signals to solid state relays 1130 to release and apply brake 1131. The optical circuits of light circuit 94 may transmit a light interruption signal to controller 1140. Controller 1140 can then transmit a signal to solid state relays 1130 resulting in brake 1131 being applied. Output module 1104 also transmits signals to relay 1124 to switch the output signals of driver 1124 between the present positioner system (stage 1) and an additional positioner system (stage 2).

Indexer 1120 shown in FIG. 18 is also capable of transmitting a signal indicative of the rotation of motor 212. A signal generated by indexer 1120 indicative of the rotation of the stepper motor can be transmitted into input module 1105 for use by processor system 1090.

Thus, a variety of mechanisms are used in order to determine the actual location of test head 110. Vertical position is detected in one of several ways. When the test head 110 is initially being lowered towards device handler 120, the (coarse) vertical position of test head 110 is initially determined as a result of signals generated by inclinometer 510. Specifically, processor system 1090 is programmed with the relationship between the vertical position of test head 110 and the angular position of linkage structure 20*b*.

Thus, when processor system 1090 receives signals from inclinometer 510, processor system 1090 converts these signals into the vertical position of test head 110. As test head 110 approaches device handler 120, the position of test head 110 is determined using Distance Sensors 1015. As each Distance Sensor 1015 makes contact with the respective alignment pin base 1007 and test head 110 continues to move towards device handler 120 the pin extending from each Distance Sensor 1015 is pushed inwards. Each Distance Sensor then transmits a signal to processor system 1090 indicative of the distance by which each Distance Sensor's spring loaded pin is pressed inwards. The more each Distance Sensor's spring loaded pin is pressed inwards (i.e., the greater the compression—distance of each Distance Sensor) the closer test head 110 is to device handler 120.

The Distance Sensors 1015 shown, for example, in FIG. 12 (identified again as DS1, DS2, etc. in FIGS. 14*a*–*e*) can be used to measure roll and pitch of the test head and distance (i.e. compression) of test head 110 relative to device handler 120 (hereafter "interdistance") depending upon how many Distance Sensors are used and where each Distance Sensor is placed.

Roll measures the difference in distance between the right side 110*a* of the test head 110, and device handler 120 and the distance between the left side of 110*b* of test head 110 and device handler 120. Roll is positive when right side 110*a* is lower then left side 110*b*. In an exemplary embodiment of the present invention, the measurement is in milli-inches. Roll is calculated in accordance with equation 1 when four Distance Sensors as illustrated in FIG. 14*a* are used.

$$\text{roll} = [(DS3+DS4) - (DS1+DS2)]/2 \quad (1)$$

Pitch measures the difference in over distance between the rear side 110*d* of test head 110 and device handler 120 and the distance between the front side 110*c* of test head 110 and device handler 120. Pitch is positive when the rear side 110*d* is higher then the front side 110*c*. In an exemplary embodiment of the present invention, the measurement is in milli-inches. Pitch is calculated in accordance with equation 2 when four Distance Sensors as illustrated in FIG. 14*a* are used.

$$\text{pitch} = [(DS1+DS4) - (DS2+DS3)]/2 \quad (2)$$

Interdistance measures the distance between test head 110 and device handler 120 (i.e., the distance indicated based upon the Distance Sensors in use). This may be, for example, the average distance between each side 110*a*–*d* of test head 110 and device handler 120. In an exemplary embodiment of the present invention, this measurement is made in milli-inches. Interdistance is calculated according to equation 3 when four Distance Sensors as illustrated in FIG. 14*a* are used.

$$\text{interdistance} = (DS1+DS2+DS3+DS4)/4 \quad (3)$$

Figure 14B:
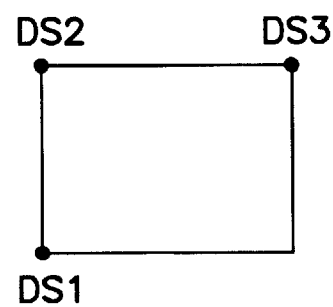

As shown in FIGS. 14*b*–14*e*, there are many different configurations regarding the placement of the Distance Sensors. FIG. 14*b*, for example, shows the usage of three Distance Sensors. Using three sensors, roll is calculated according to equation 4.

$$\text{roll} \ (2DS3 - DS1 - DS2)/2 \quad (4)$$

Pitch is calculated according to equation 5.

$$\text{pitch} = (2DS1 - DS2 - DS3)/2 \quad (5)$$

Interdistance is calculated according to equation 6.

$$\text{interdistance} = (DS1+DS2+DS3)/3 \quad (6)$$

In the embodiment of FIG. 14*b*, a fourth Distance Sensor can be added to provide redundant readings.

Figure 14C:
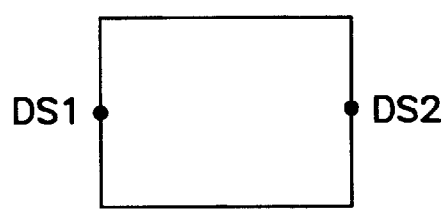

FIG. 14*c* shows two sensors situated along the pitch (X) axis. Because the two sensors are situated along the pitch axis, pitch is not calculable. Roll, however, is calculated in accordance with equation 7.

$$\text{roll} = DS2 - DS1 \quad (7)$$

Interdistance is calculated in accordance with equation 8.

$$\text{interdistance} = (DS1+DS2)/2 \quad (8)$$

Figure 14D:
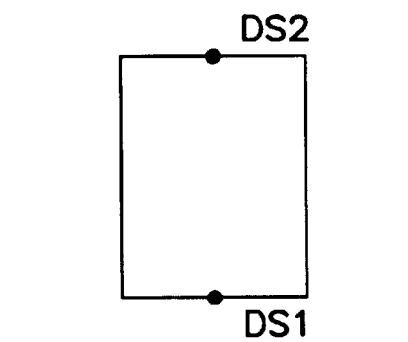

As shown in FIG. 14*d*, the two sensors may be located on the roll (X) axis. When configured in this manner, roll is not calculable. Pitch, however, is calculated in accordance with equation 9.

$$\text{pitch} = DS1+DS2 \quad (9)$$

Interdistance is calculated in accordance with equation 10.

$$\text{interdistance} = (DS1+DS2)/2 \quad (10)$$

Figure 14E:
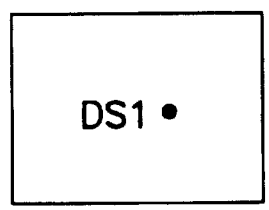

Finally, as shown in FIG. 14*e*, it is possible to use only one sensor. When using one sensor, neither roll nor pitch is calculable. Interdistance, however, is simply a function of the distance indicated by the sole Distance Sensor.

It will be understood to one of ordinary skill in the art that the configuration shown in FIGS. 14*a*–14*e* are merely illustrative of numerous configurations which may be used for the Distance Sensors. Also, each of the equations set forth above could be readily recalculated for different Distance Sensor positions by one of ordinary skill in the art. The equations set forth above are for illustrative purposes only.

Using the Distance Sensors and the inclinometers 510, 512 (or other vertical position determining devices), it is possible to "teach" the test head to be in one of several positions with regard to the device handler. These positions could be defined as follows:

docked: the docking surface of the test head is facing and in contact with the docking surface of the device handler;

undocked: the docking surface of the test head is facing the docking surface of the device handler, but separated from it;

manual: the test head is separated from the device handler. The test head may be rolled so that the docking surface of the test head is perpendicular to the docking surface of the device handler; and maintenance: the test head is separated from the device handler. The test head may be rolled so that the docking surface of the test head is rotated 180° away from the docking surface of the device handler.

In order to perform automatic docking of test head 110 with respect to device handler 120, processor module 1010 is "taught" the docked position of test head 110 after the initial mechanical installation and alignment of test head 110 and device handler 120 (previously described) has been accomplished. Processor 1010 is "taught" the docked position of test head 110 after calibration of alignment pins 1005 and alignment holes 1020 as previously described and relative to device handler 120 as follows.

Initialization

Figure 19:
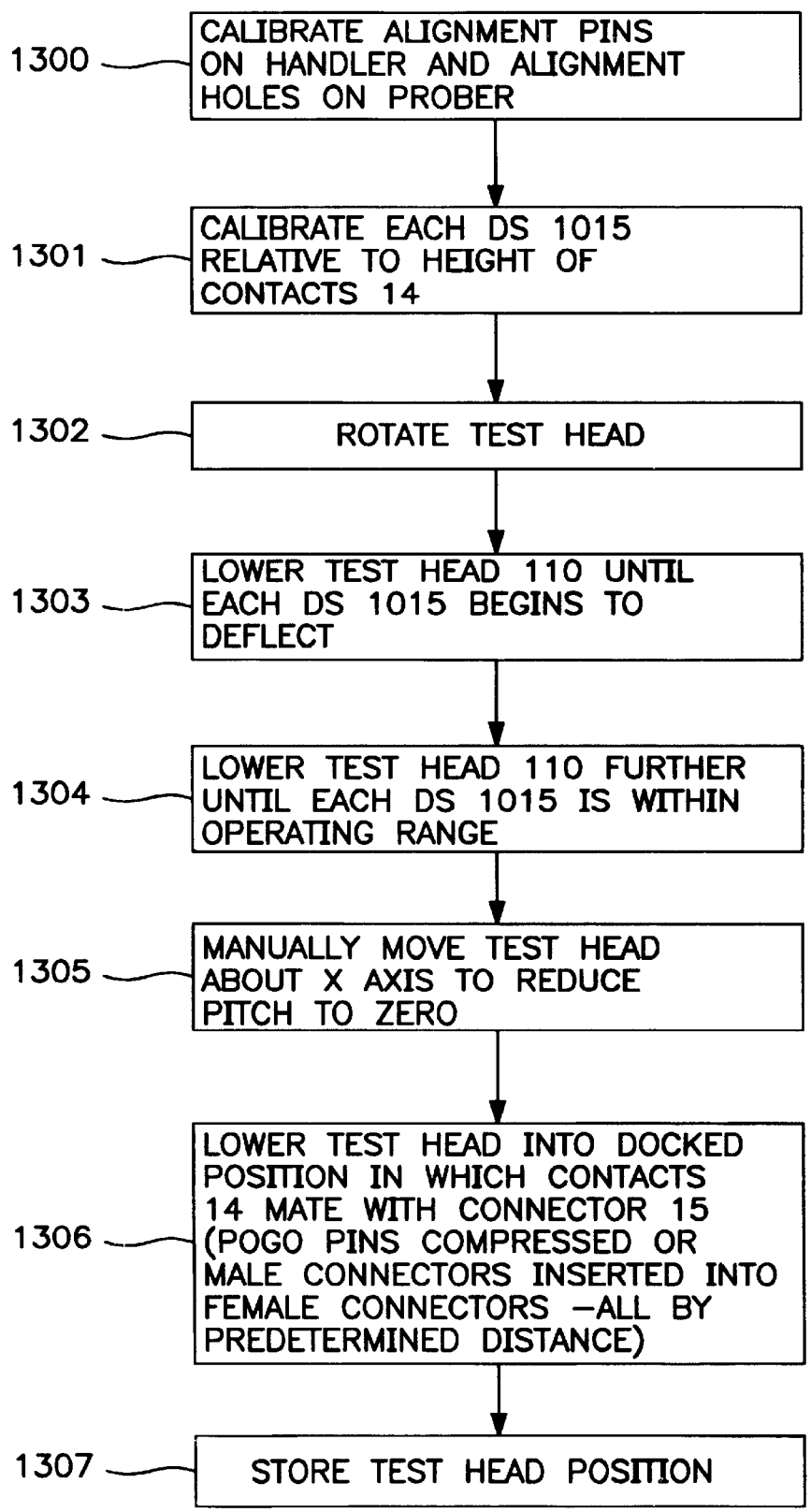
FIG. 19 is a flow chart diagram which illustrates programming of the processor system for performing automatic docking.

As shown in FIG. 19 at step 1300, the positioning of alignment pins 1005 and alignment holes 1020 as previously described is accomplished. At step 1301, each of the one or more Distance Sensors is calibrated relative to the height of contacts 14 as previously described with reference to FIG. 15. At step 1302, test head 110 is rotated (e.g., manually) about the Y axis so that the test head docking surface and the device handler docking surface are substantially parallel. At step 1303, stepper motor 212 is manually actuated in order to bring test head 110 approximately parallel to device handler 120. To actuate this motor, operator terminal 48 is programmed with push buttons MOVE UP and MOVE DOWN for actuating the stepper motor 212 in the appropriate direction. The test head is then lowered until each present Distance Sensor begins to make contact with the device handler and each Distance Sensor begins to compress. As test head 110 is lowered, the speed of stepper motor 212 is decreased. Next, at step 1304, the MOVE DOWN push button is depressed to lower the test head until one or more Distance Sensors present are within operating range (e.g., plus or minus 0.2500 inches). At step 1305, test head 110 is manually moved along the X axis to reduce the pitch to 0. This is accomplished by loosening locks group 503. The roll about the Y axis is then checked and readjusted if necessary. At step 1306, the MOVE DOWN push button is depressed to lower test head 110 so that, for example, the pogo pins which comprise contacts 14 are compressed (as determined by the signals generated by the Distance Sensors) by a desired distance (or the male connectors on test head 110 are inserted into the female connectors on device handler 120 by a desired distance). Roll is automatically adjusted as a result of the test head self leveling relative to the device handler. In other words, if the test head is tilted when it reaches docking position, the force of the device handler towards the test head will cause the test head to rotate so that the force between the test head and the device handler is evenly distributed. Pitch is then readjusted as necessary. At step 1307, when the desired docking position has been achieved, a TEACH DOCKED push button on operator terminal 48 is depressed. This stores the roll, pitch and compression settings of the Distance Sensors in a memory of processor module 1110 as shown in more detail in teach back Block of FIG. 24.

With regard to step 1306 (described above) there are various teachings in the art as to how close test head 110 and device handler 120 should be. This distance is carefully measured because this distance relates to the total distance by which pogo pins (if contacts 14 are pogo pins) are compressed or the total distance (if contacts 14 are male/female connectors) by which the male connectors are inserted into the female connectors counterparts). The distance by which the pogo pins should be compressed (or the male connectors inserted into the female connectors) will vary widely depending upon the manufactures and specifications of the pogo pins (or male/female connectors). However, the pogo pins will typically be compressed 80% of total available stroke (or the male connector will be inserted 80% of the female connector's depth). Thus, by measuring the distance between test head 110 and device handler 120 by using each Distance Sensor 1015, test head 110 can be lowered for the desired distance of compression of the pogo pins (or insertion depth using male/female connectors).

Figure 20:
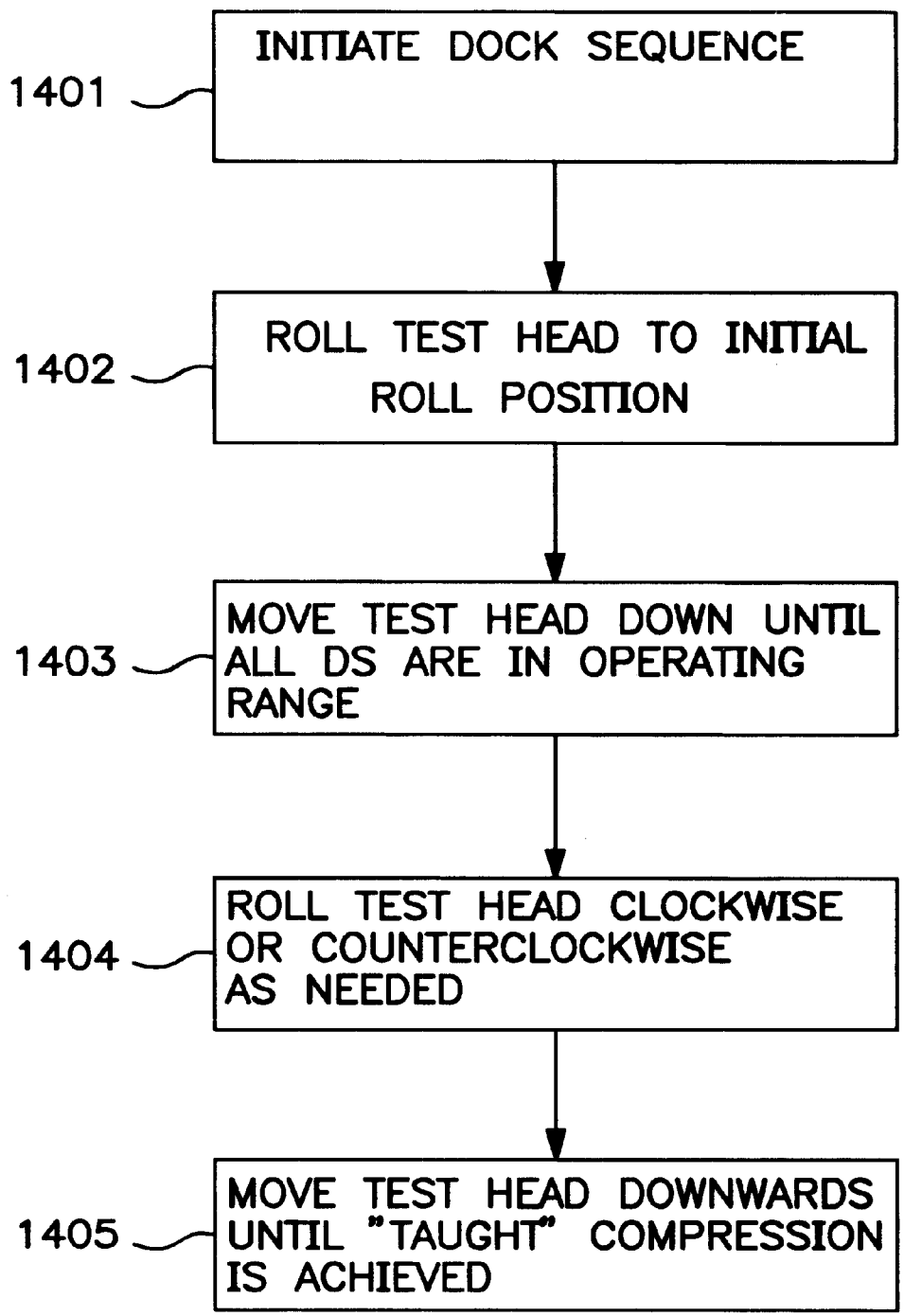
FIG. 20 is a flow chart diagram which illustrates manipulation of the test head during automatic docking.
Figure 2I:
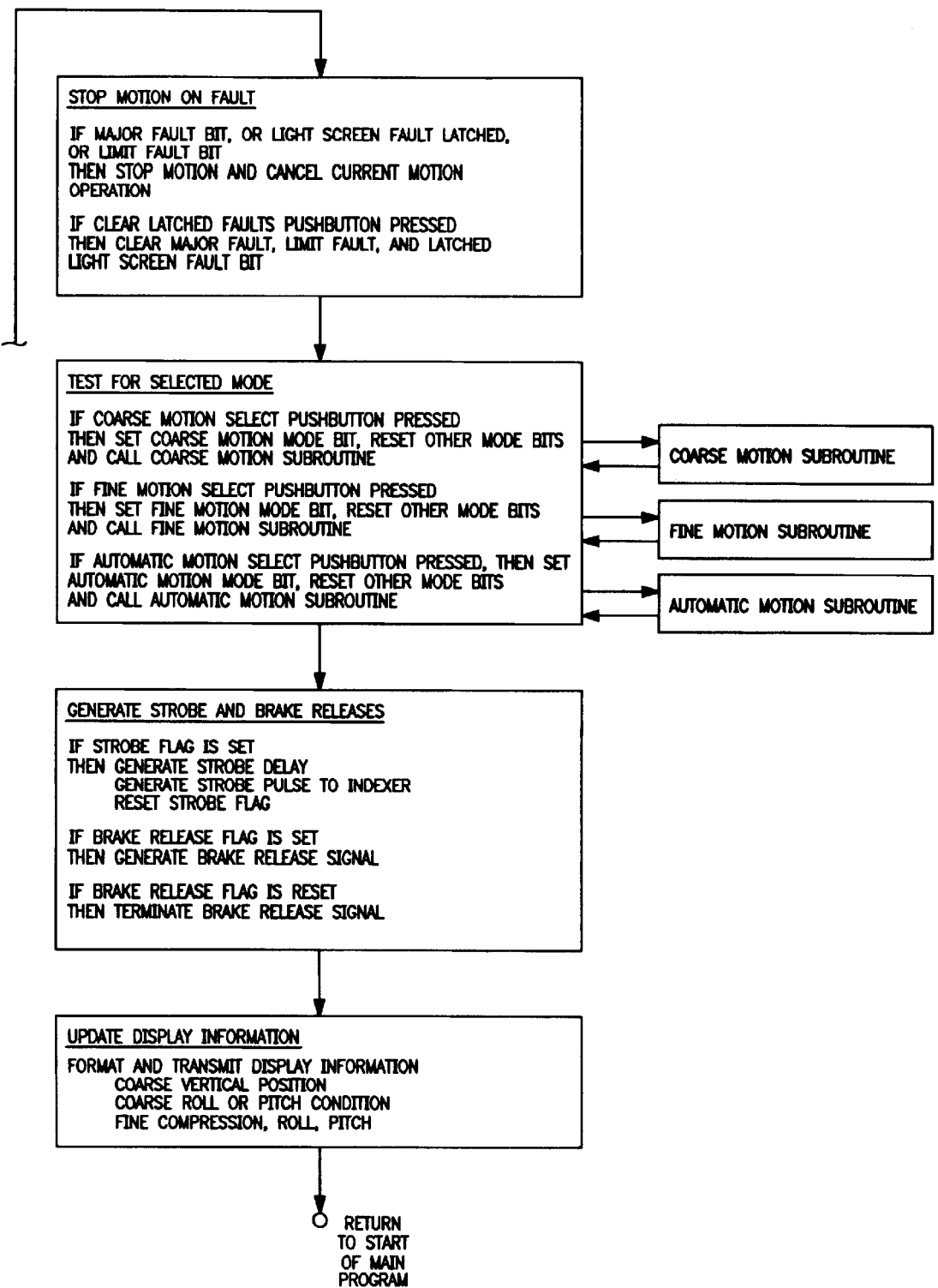

Once the docked position of test head 110 relative to device handler 120 has been "taught" to processor module 1110, tesit head 110 can automatically be docked to device handler 120. This is accomplished as follows with reference to FIG. 20. At step 1401, a DOCK push button on operator terminal 48 is depressed. If based on the reading of inclinometer 510 the test head is below a predetermined level, the test head is raised. This avoids test head 110 making contact with device handler 120 accidentally while test head 110 is being rotated. At step 1402, test head 110 is rolled (e.g., manually) to an initial roll position. At step 1403, processor system 1090 transmits signals to indexer 1120 for stepper motor 212 to move test head 110 down until all Distance Sensors have made contact and are within operating range. Downward motion then continues. At step 1404, test head 110 rolls clockwise or counter clockwise until force is equally distributed in all places where test head 110 and device handler 120 make contact. At step 1405, processor system 1090 provides appropriate signals for stepper motor 212 to move test head 110 down until the interdistance (i.e. compression) matches the taught interdistance (i.e. compression) within plus or minus a preprogrammed amount (e.g. 0.002").

Misalignment during automated docking between test head 110 and device handler 120 will result in misalignment between alignment hole 1020 and respective alignment pin 1005. Misalignment between alignment hole 1020 and respective alignment pin 1005, as previously explained, will result in the misalignment sensors indicating a misalignment along the X axis or Y axis). This may be indicated by load detection from load cell 1010. Thus, if load cells are being used, the detection of load from load cell 1010 indicates misalignment between test head 110 and device handler 120 and docking can be aborted until the cause of the misalignment is repaired.

As previously described, the test head may be in the manual or maintenance positions. An "undocked" position, with test head 110 moved away from device handler 120 also exists. Each of these positions may be "taught" to processor from terminal 48. Specifically, the test head is raised to the desired height and rolled to the desired orientation using MOVE UP and MOVE DOWN (e.g., manually) push buttons. TEACH UNDOCKED, TEACH MANUAL, and TEACH MAINTENANCE push buttons may then be depressed to store the respective positions of test head 110 within processor svstem 1090. Once processor system 1090 has been "taught" the undock, manual and maintenance positions (i.e., vertical positions), these positions may be automatically achieved by pressing the respective push buttons on monitor 48. In each case, when the appropriate push button is pressed, the test head is usually raised to its top most position, rolled as desired, and then lowered to the "taught" height. It is desirable to raise the test head to its top height (or near its top height) before rolling the test head to assure adequate clearance between the test head and the device handler.

FIGS. 21–29 are flow chart diagrams which illustrate with some level of detail, the operation of processor module 1110 within processor system 1090.

FIG. 21 illustrates routines for updating position information, testing for major faults, testing for light screen faults, testing for limit faults, stopping motion when faults are detected, testing for various modes, generating strobe and brake releases and updating the display information. Mode selection is useful because the positioner system may be in a coarse motion mode or a fine motion mode. In the coarse motion mode, test head 110 is (relatively) far away from device handler 120. Motion of test head 110 towards device handler 120 is desirably faster than if test head 110 is (relatively) close to device handler 120. The various sensors may be used to determine the distance between test head 110 and device handler 120 so that coarse or fine motion may be used. While in one exemplary embodiment of the present invention a servo motor may be used, it is also possible to use other types of motors, such as a stepper motor. If a stepper motor is being used to achieve vertical motion, then during coarse motion the motor may receive current continuously. By contrast, during fine motion with a stepper motor being used to achieve vertical motion, the motor may be pulsed.

Figure 22:
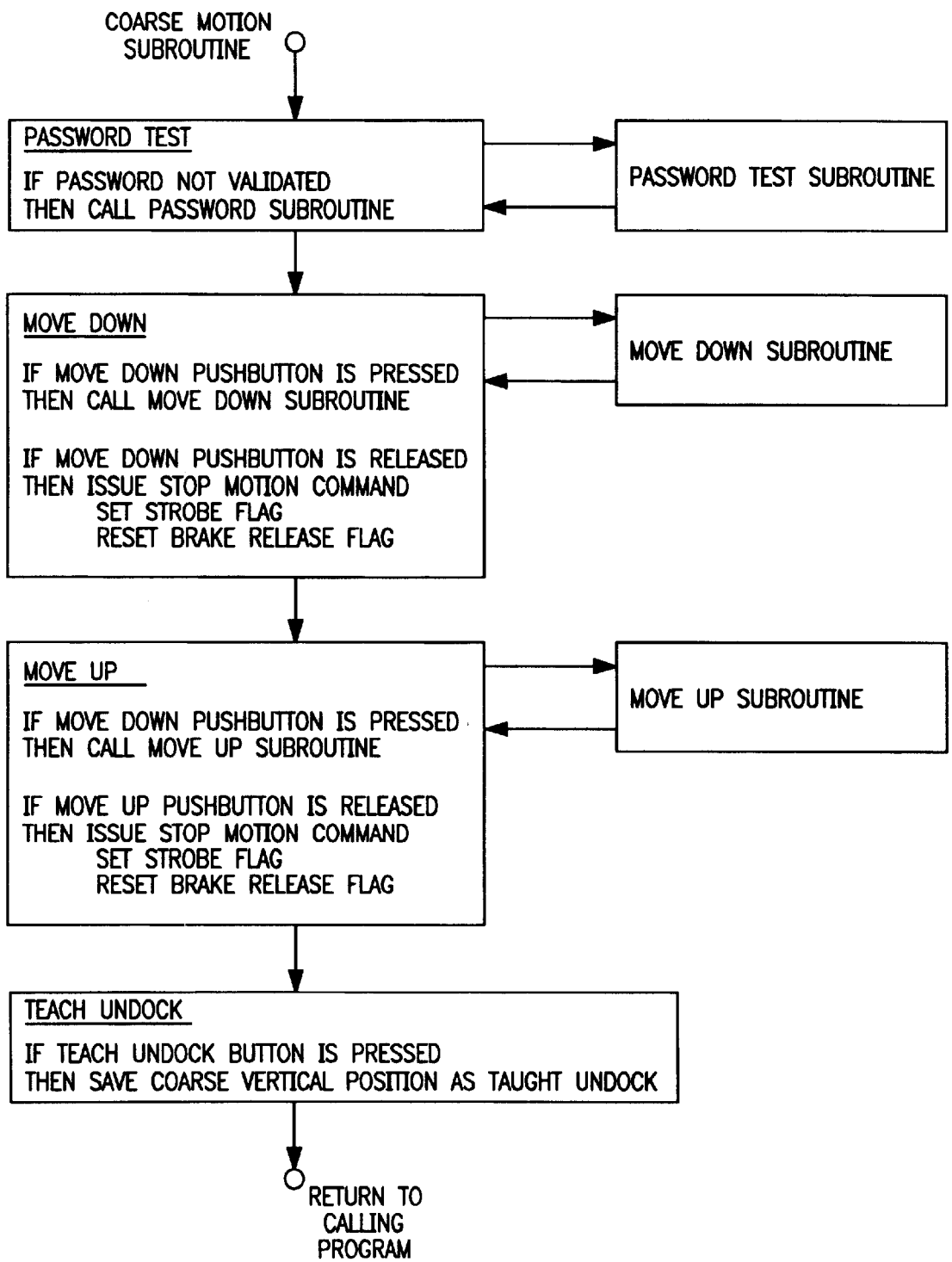

FIG. 22 illustrates routines for coarse motion. These routines include a password test (to prevent unauthorized use of the positioner system), moving the test head up and down, and storing a position of the test head as a final position when undocking (and hence depression of the undock button) is achieved.

Figure 23:
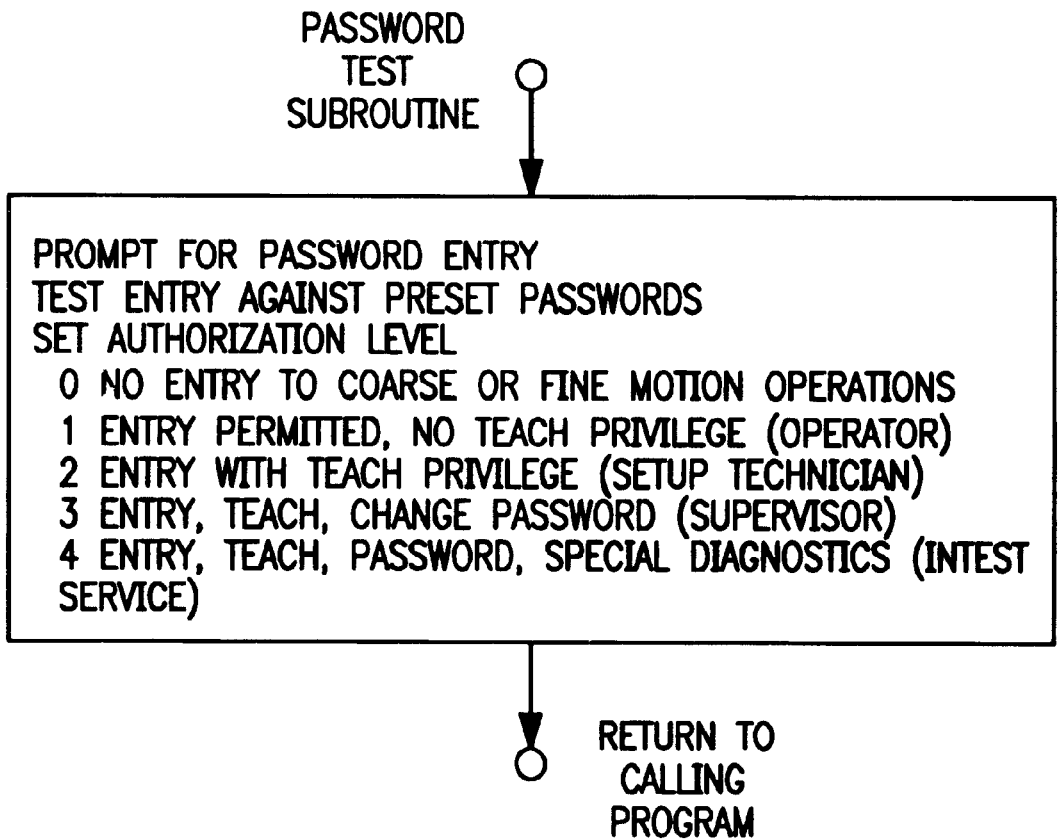

FIG. 23 illustrates routines for testing a password used to control access to the functions of the positioner system.

Figure 24:
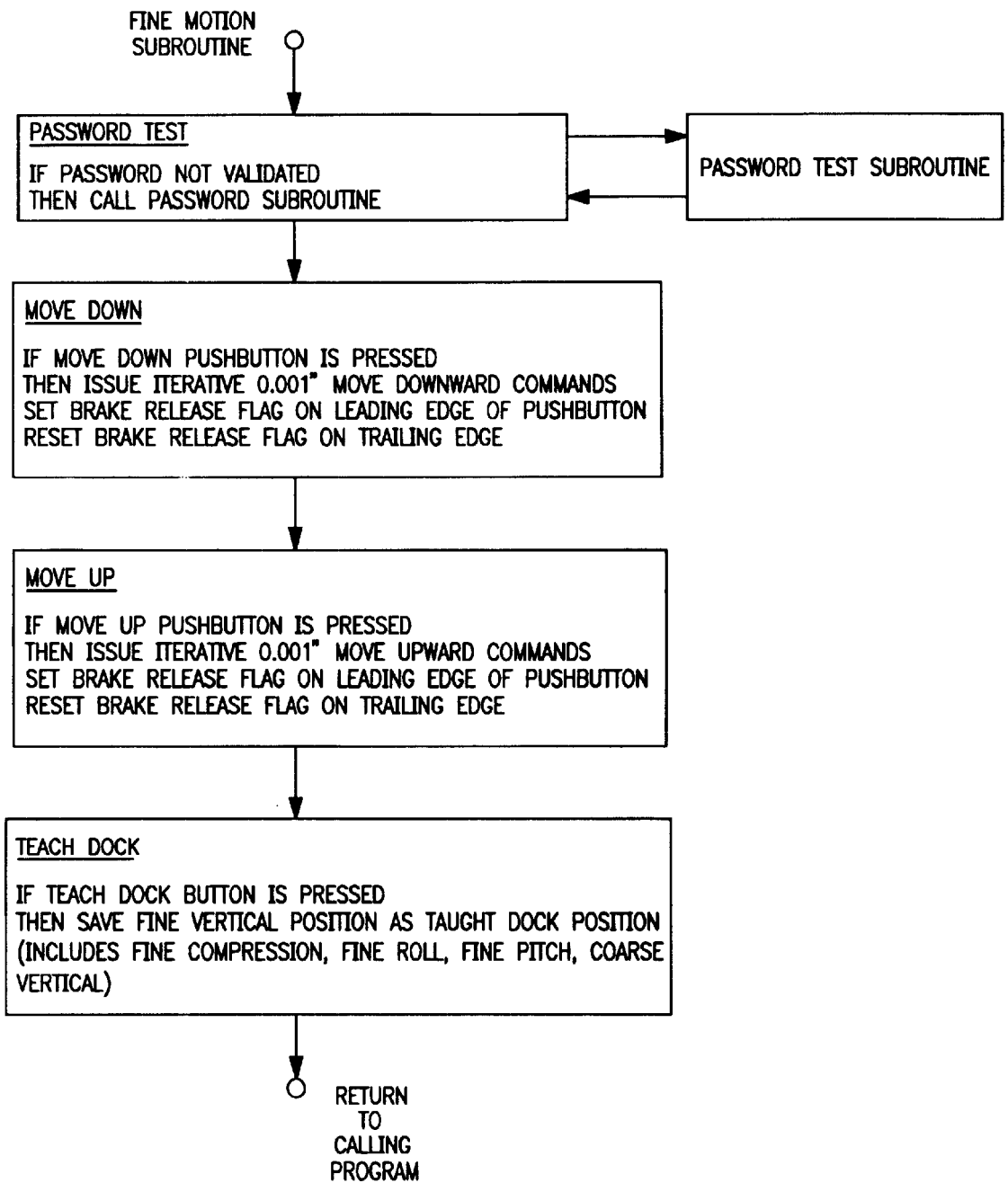

FIG. 24 illustrates fine motion subroutines including a password test, moving the test head up and down, and storing a position of the test head which is where the test head should be when docking is desired (and which is hence achieved by pressing the dock button).

Figures 25, 25A:
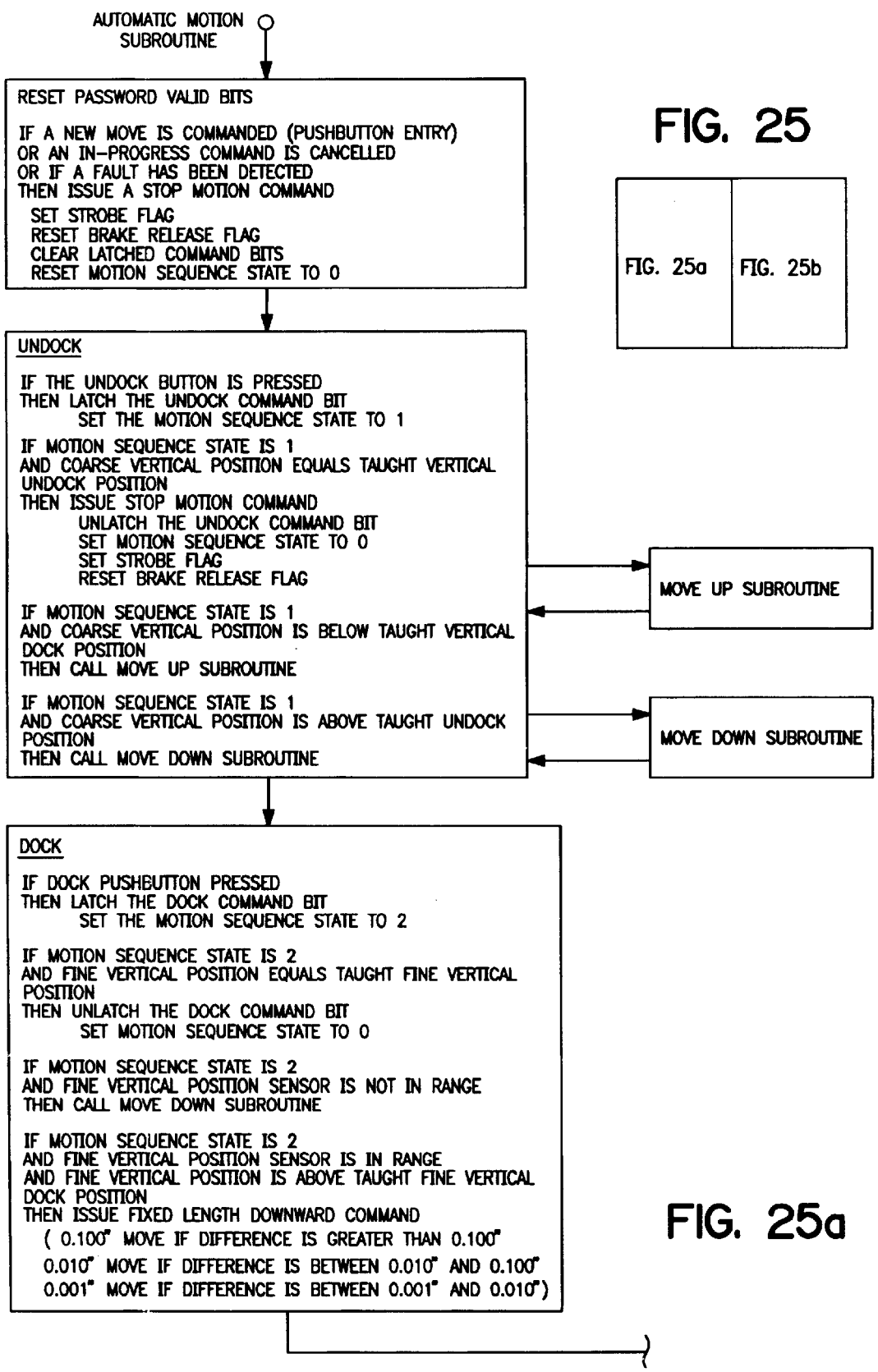
Figure 25B:
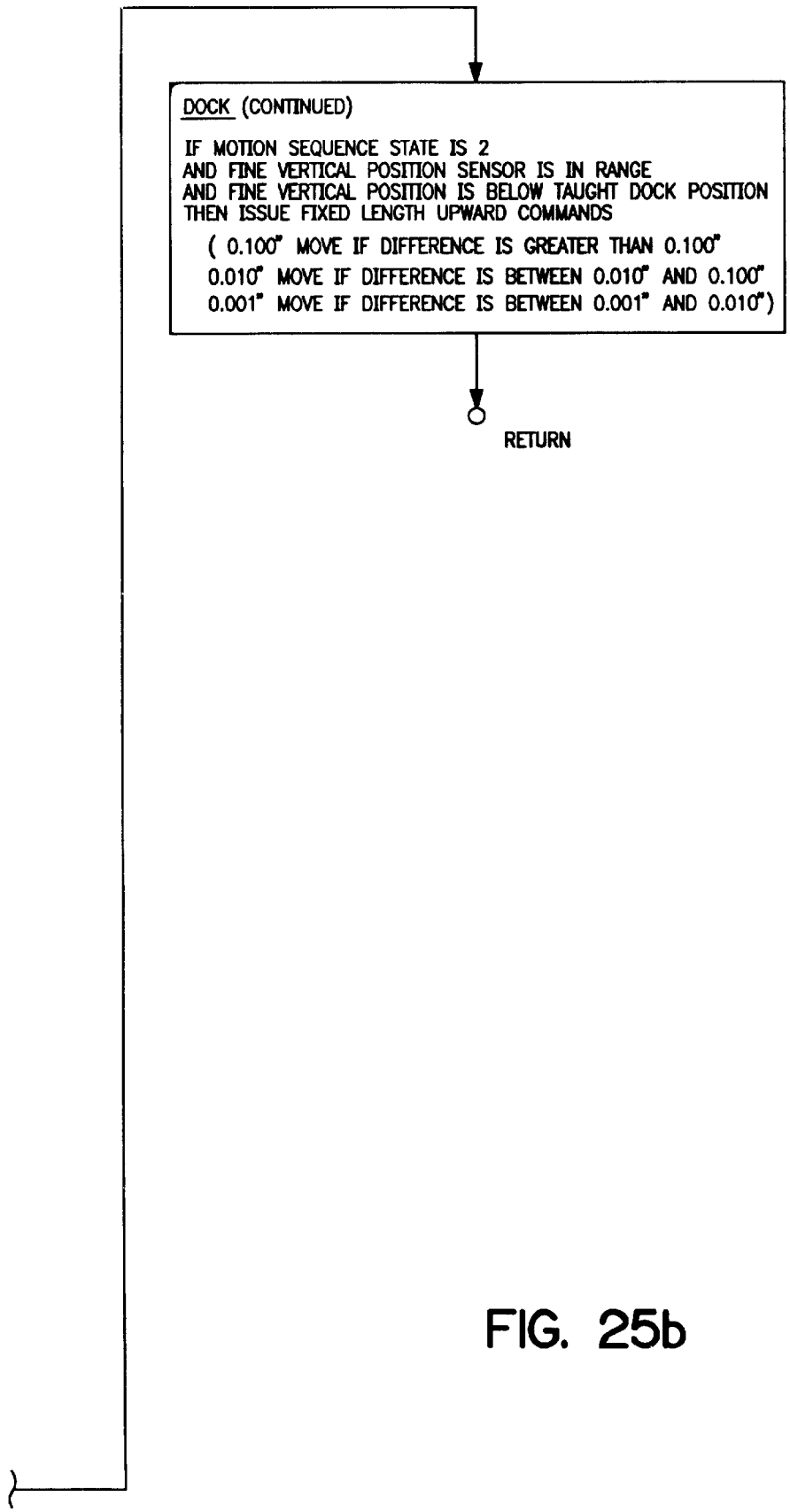

FIG. 25 illustrates automatic motion subroutines including docking and undocking the test head to the device handler.

Figure 26:
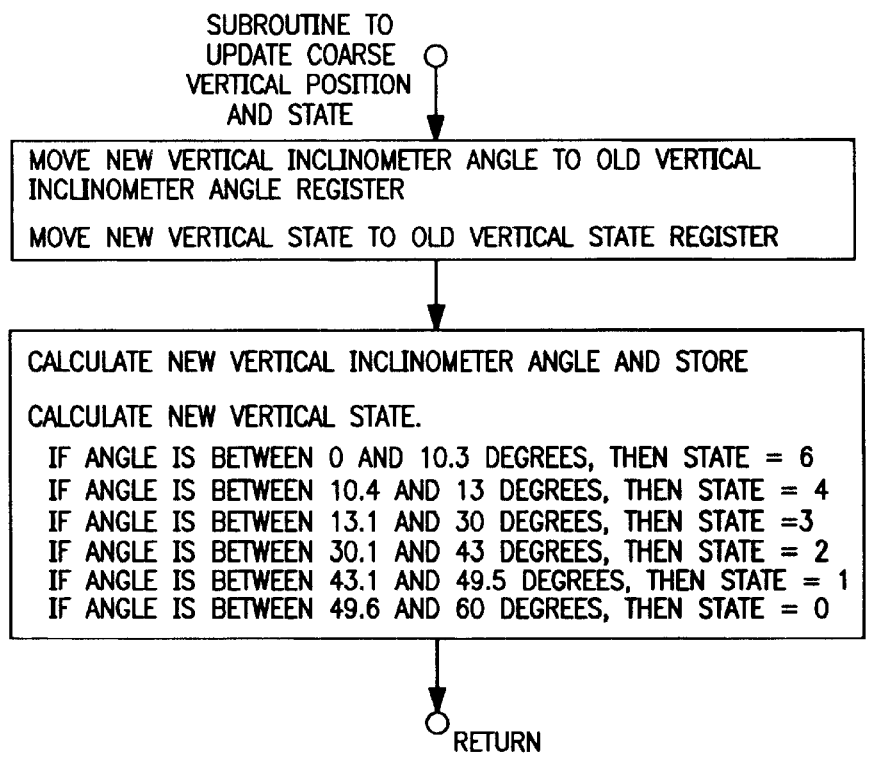

FIG. 26 illustrates routines for updating the coarse vertical position and state.

Figure 27:
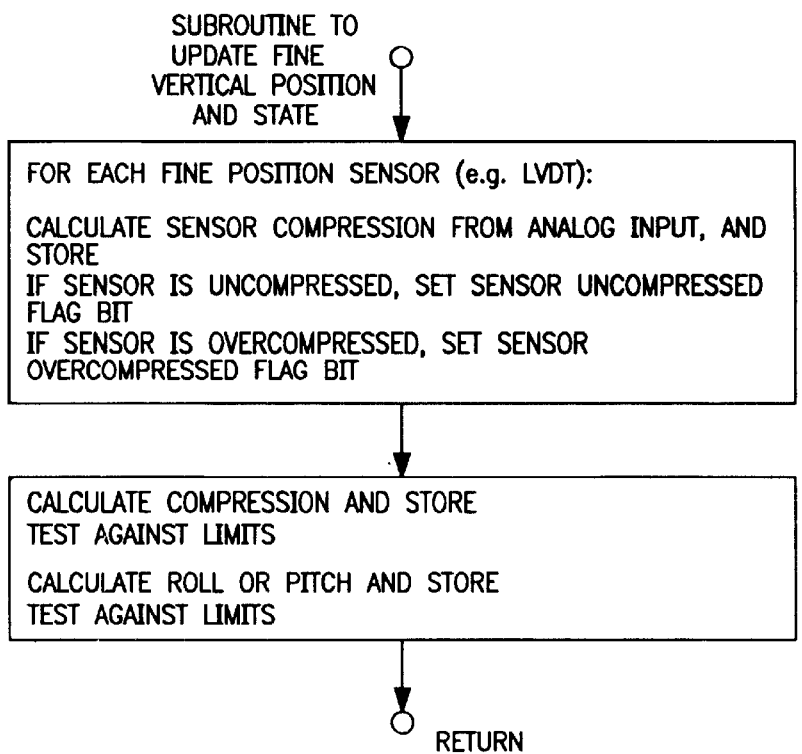

FIG. 27 illustrates routines for updating the fine vertical position and state.

Figure 28:
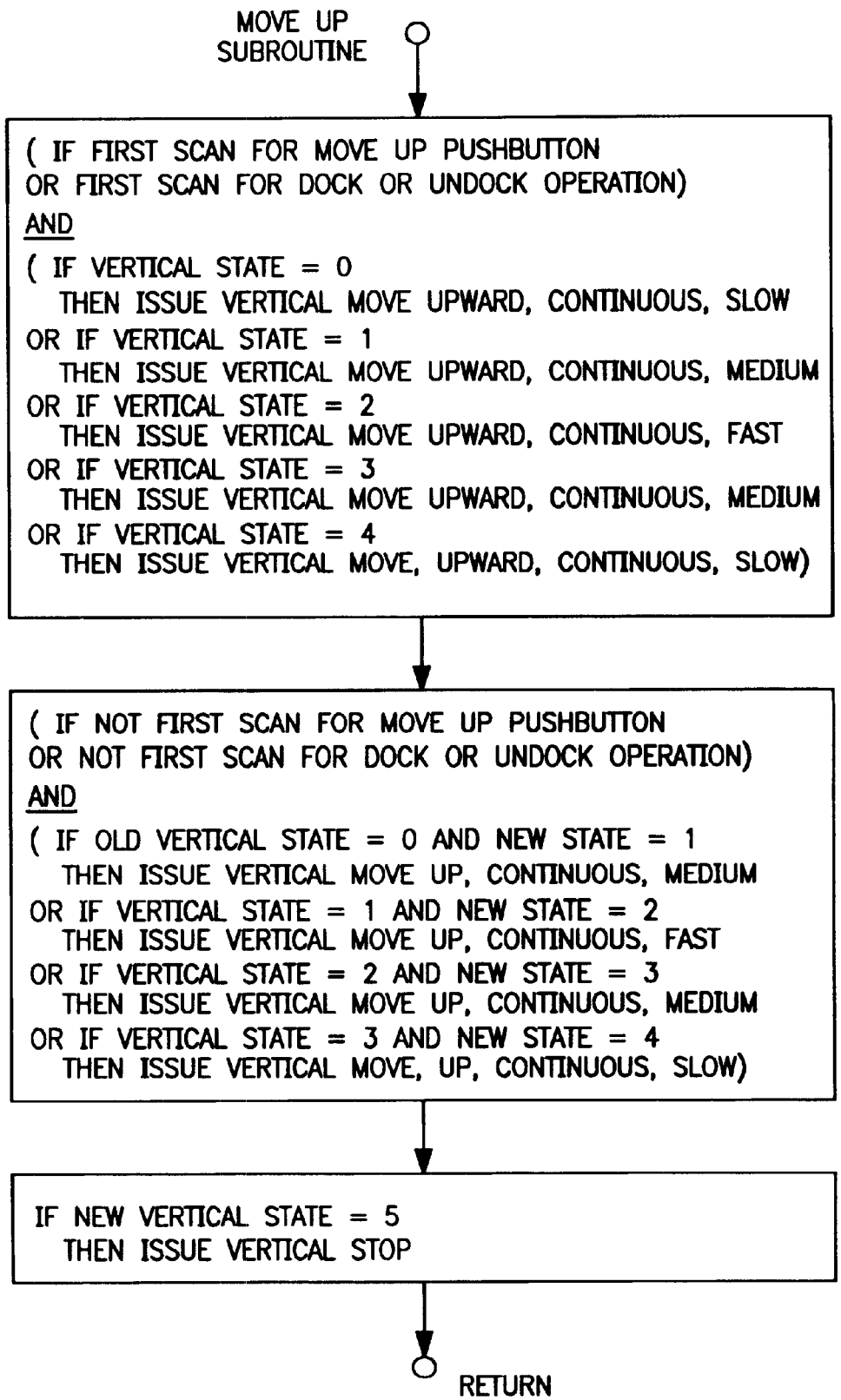

FIG. 28 illustrates routines for moving the test head up.

FIG. 29 illustrates routines for moving the test head down.

Figure 30:
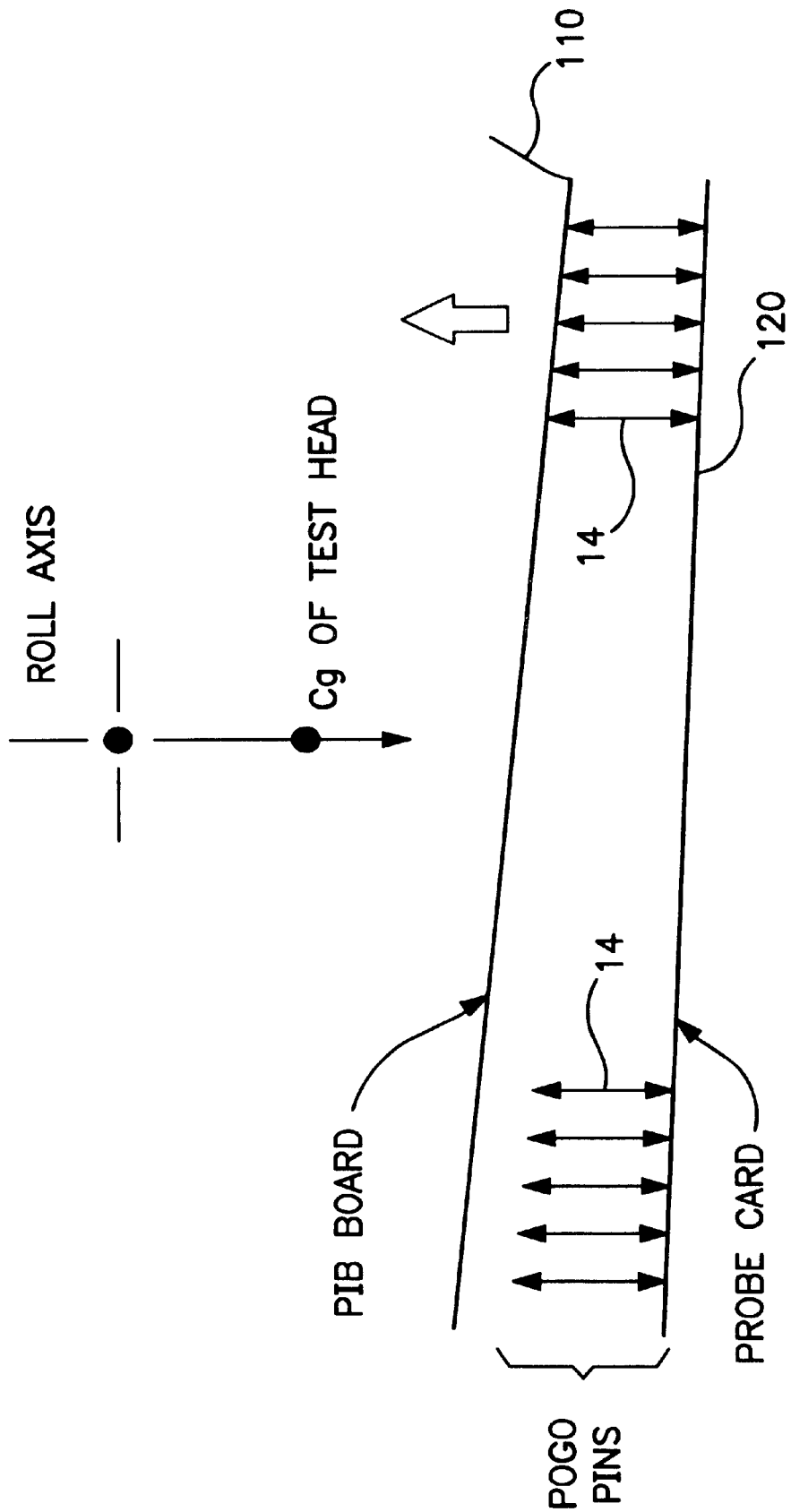
Figure 3I:
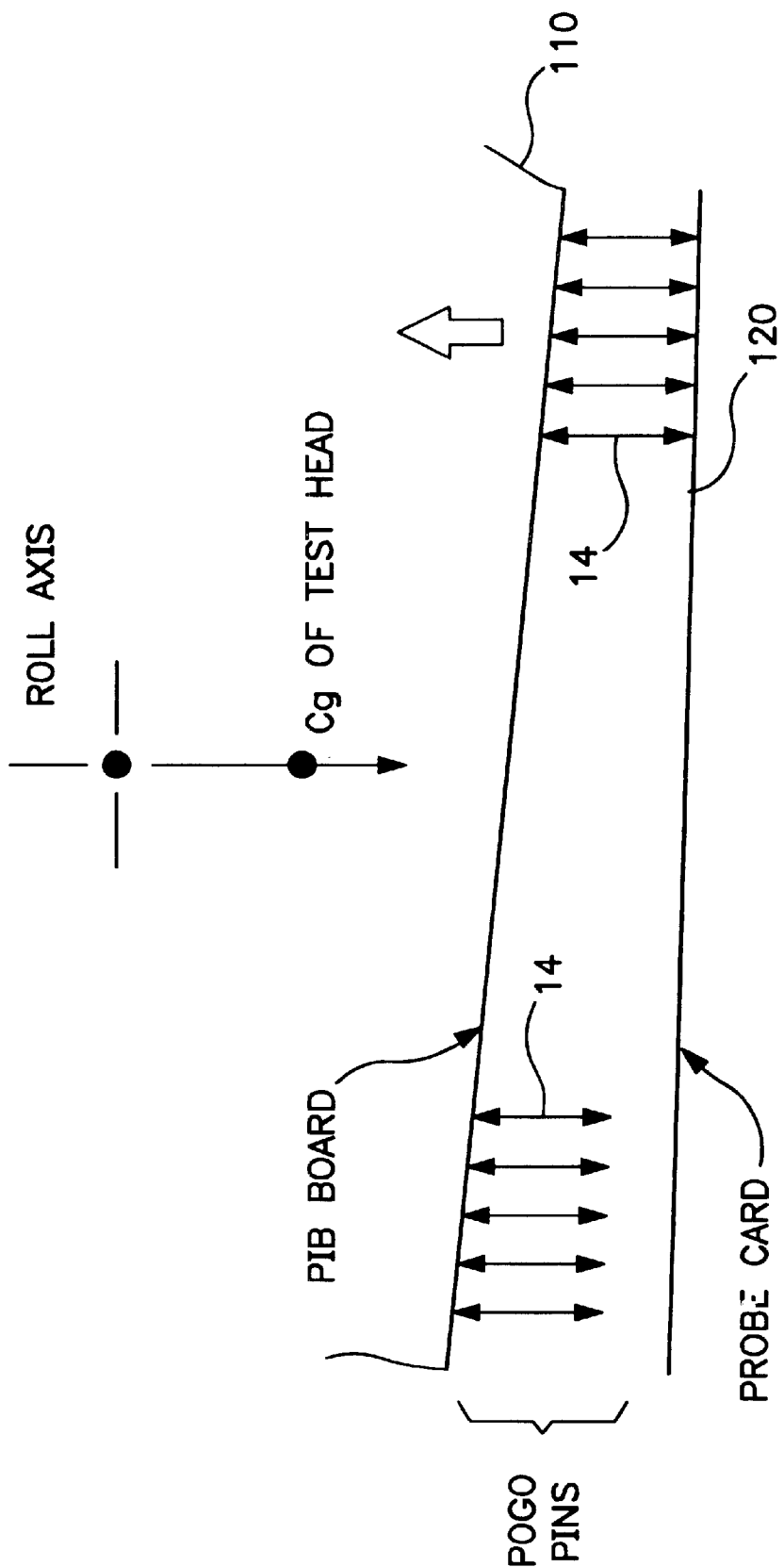

FIGS. 30 and 31 illustrate alternative embodiments of the present invention. In FIG. 30, pogo pins are attached to device handler 120. This is opposite the configuration shown in FIG. 12 where the pogo pins are attached to test head 110. As test head 110 comes down and towards device handler 120, as shown in the example of FIG. 30, test head 110 is tilted slightly downward on the right-hand side. As a result, the pogo pins on the right-hand side will push upwards on test head 110 causing test head 110 to rotate about the roll axis so that the pogo pins ultimately exert substantially equal force on the device handler. As shown in FIG. 31 (which corresponds to FIG. 12), the pogo pins are attached to test head 110. As pogo pins make contact with device handler 120, test head 110 will again be rotated by the force of device handler 120 upwards, so that test head 110 and device handler 120 become substantially parallel.

As previously described, numerous safety mechanisms are included in order to avoid injury to the operator and damage to the equipment. For example, brake 115 may be locked when AC power is removed from the system. Brake 115 is locked before the start of vertical motion along the Z axis, and immediately after completion of vertical motion along the Z axis.

As previously stated, a light screen is included. If the light screen is penetrated, brake 115 locks immediately.

As previously stated, limit switches 80a, b are also included. These limit switches detect the ends of permissible travel of trolley 17c. The output of limit switches 80a, b sensed by processor system 1090 via input module 1105. If a limit condition is detected, any automatic motion in progress is halted, a fault message is displayed, and further motion into the limit is inhibited. There are also software limits narrower than the switch limits. An external emergency stop switch may also be included. Actuation of the external emergency stop switch locks brake 115 and opens the AC line, removing AC power from the apparatus.

Figure 32:
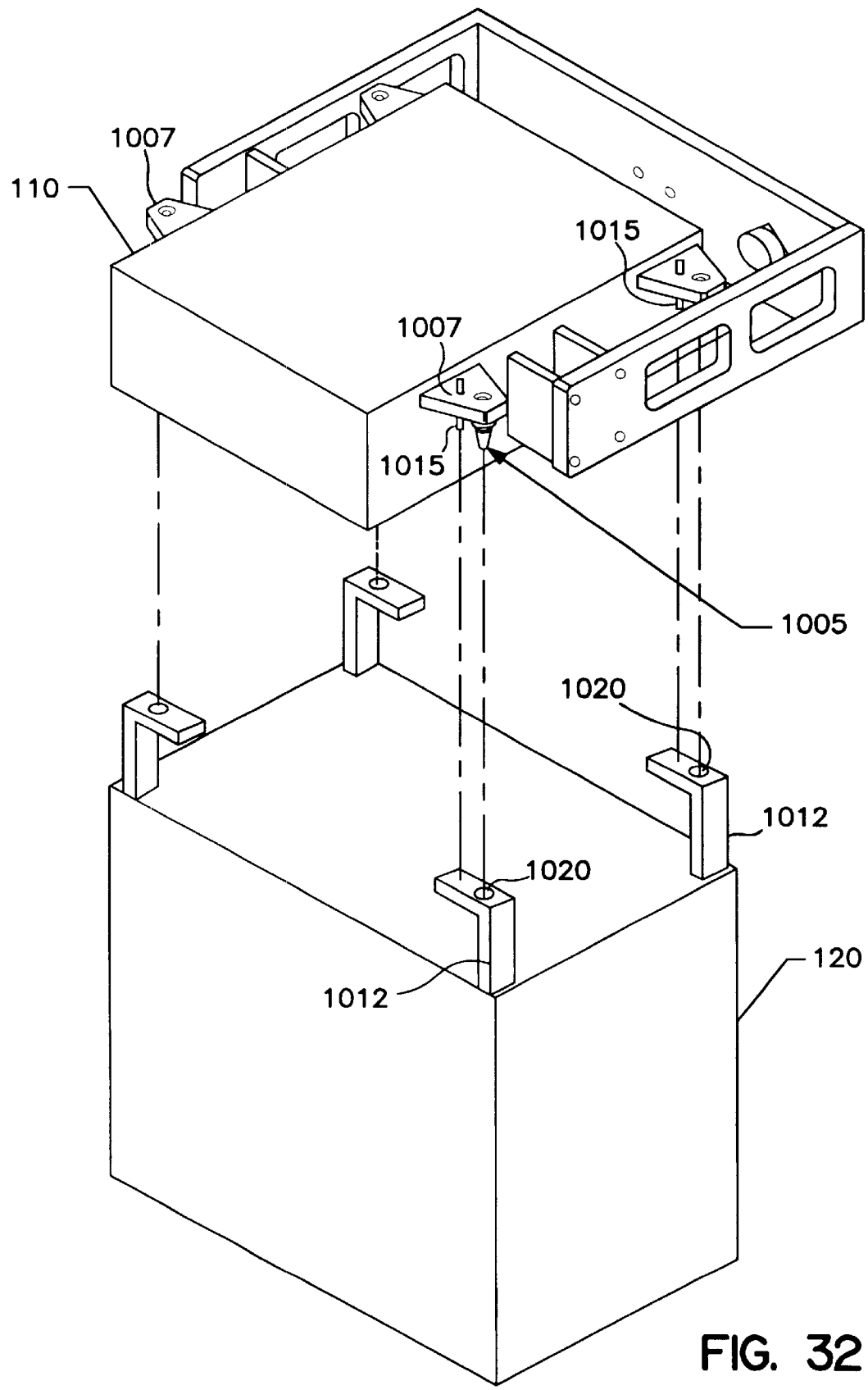
Figure 33:
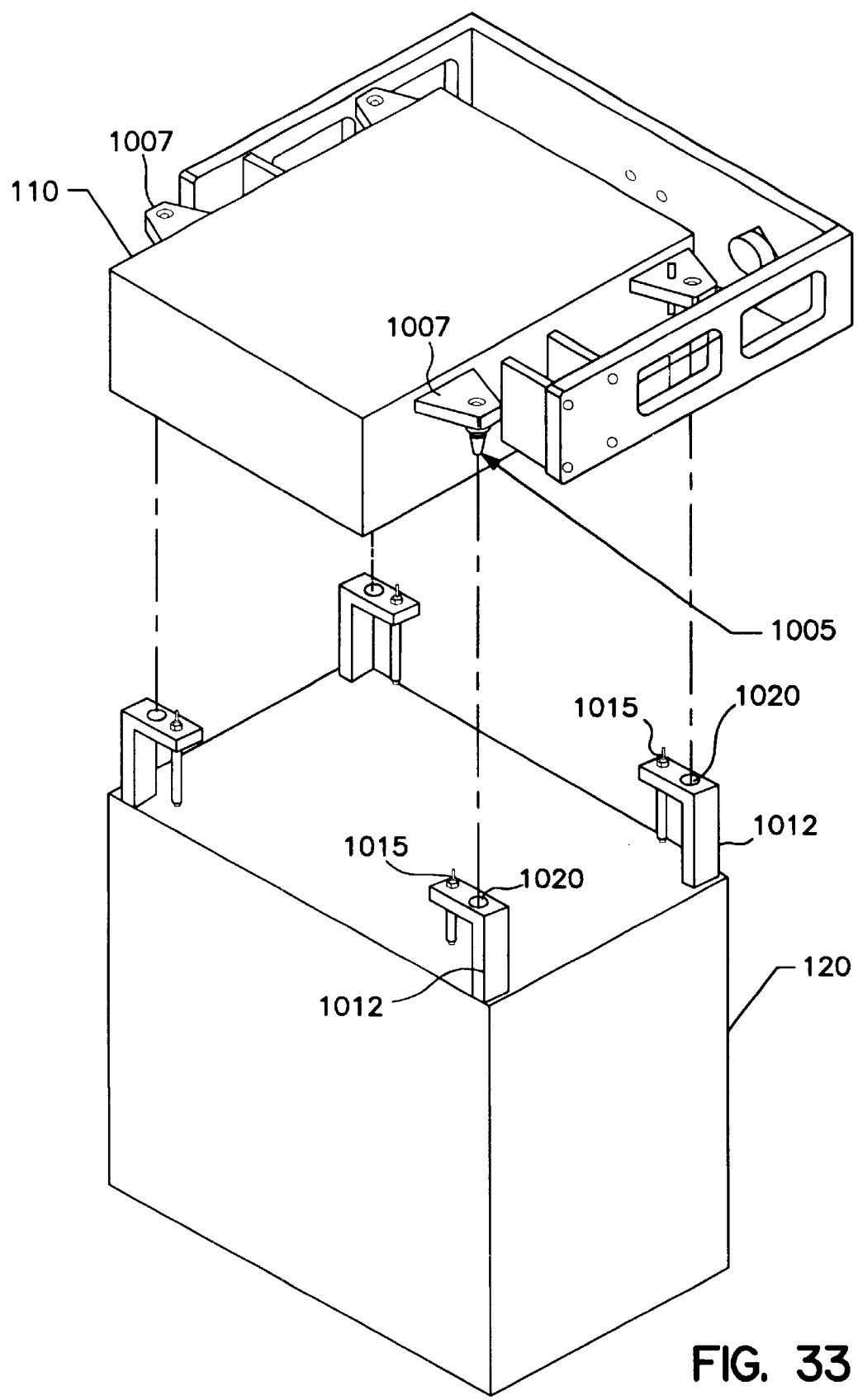

The invention has been described with each alignment pin base 1007 (each with alignment pin 1005) mounted on device handler 120 and each protection plate 1012 (each with alignment hole 1020) mounted on test head 110. However, as would be apparent to one of ordinary skill in the art, this order can be reversed so that each alignment pin base 1007 (with alignment pin 1005) is mounted on test head 110 and each protection plate 1012 (with alignment hole 1020) is mounted on device handler 120. A load cell 1010 would thus be under each alignment pin 1005 and coupled to test head 110. Each Distance Sensor 1015 would remain coupled to test head 110. As previously described, optical or other types of devices may be used to implement each Distance Sensor. If a linear potentiometer or linear variable distance transducer is used, then each Distance Sensors pin is depressed inward into each Distance Sensor after making contact with protection plate 1012. This embodiment is illustrated, for example, by FIG. 32. Alternatively, as shown in the embodiment illustrated by FIG. 33, each Distance Sensor 1015 may be mounted into each protection plate 1012 on device handler 120. Again, if a linear potentiometer or linear variable distance transducer is used, each Distance Sensors pin is depressed inward into each Distance Sensor after making contact with alignment pin base 1007.

Figure 34:
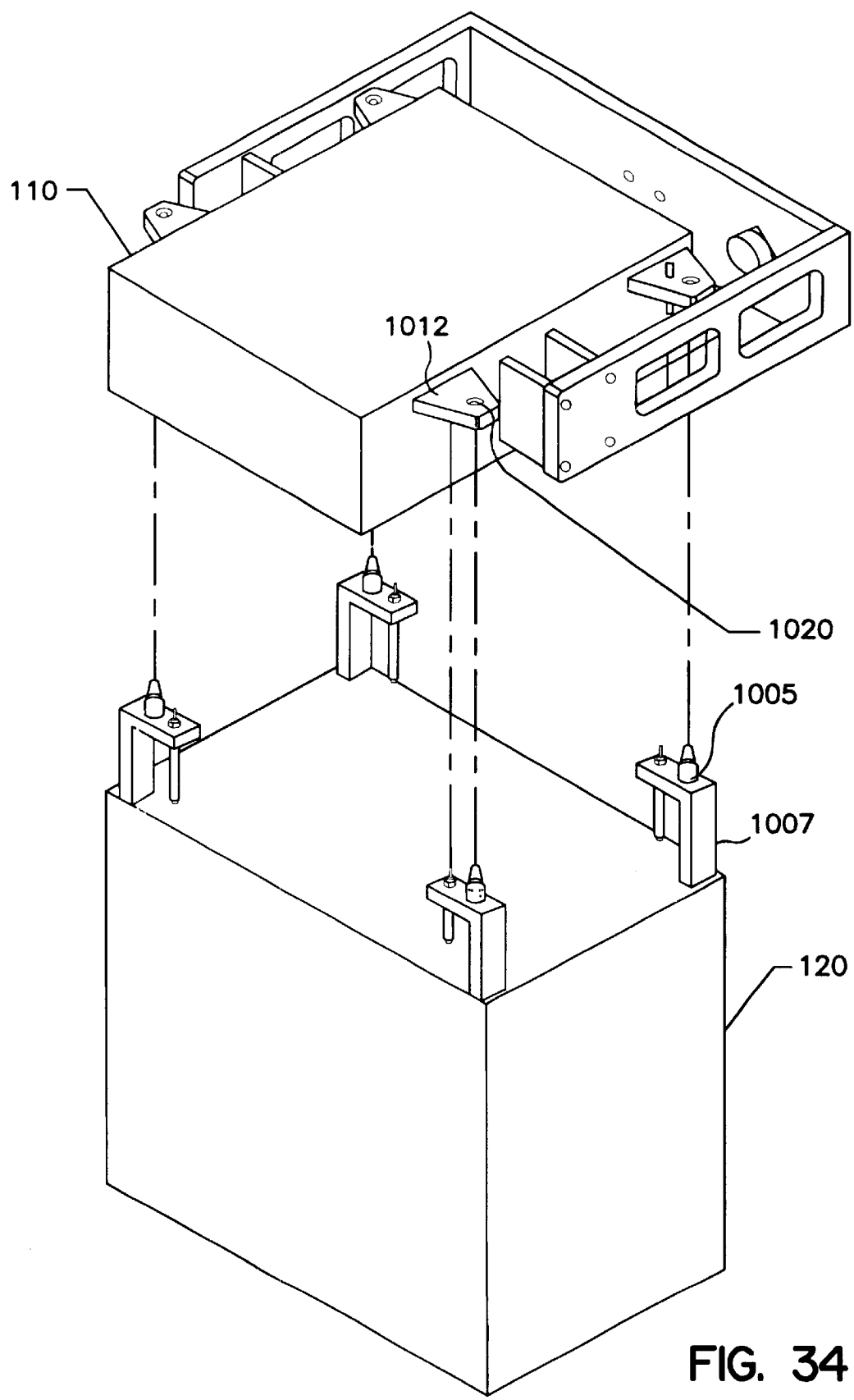

In a further alternative embodiment, illustrated, for example, by FIG. 34, each alignment hole 1020 is formed in a protection plate 1012 which is attached to test head 110 and each alignment pin base 1007 with alignment pin 1005 is attached to device handler 120. Each Distance Sensor 1015 is attached to device handler 120 instead of being attached to test head 110. Each Distance Sensors pin is depressed inward into each Distance Sensor after making contact with protection plate 1012.

The invention has been described with a load cell 1010 under each alignment pin 1005. However, one of ordinary skill in the art would recognize that load cell 1010 could be used in conjunction with alignment hole 1020 instead. For example, alignment hole 1020 could be the opening of a floating bushing installed within protection plate 1012. Load cell 1010 could be appropriately positioned relative to the floating busing so that movement of the floating bushing relative to protection plate 1012 results in a load on load cell 1010. Thus, for example, if alignment pin 1005 does not accurately engage alignment hole 1020 (i.e. pin 1005 engages hole 1020 at an angle or not at all), load cell 1010 would signal a load (indicative of inaccurate docking). In this manner, accurate docking between contacts 14 and connectors 15 is again ensured. Furthermore, although four load cells have been described and illustrated, it is possible that fewer than four load cells may be used to indicate misalignment along the X axis or Y axis (or misalignment about the Z axis).

The invention has been described with the use of Distance Sensors to determine the position of test head 110 relative to device handler 120. However, as previously described, other types of proximity sensors (non-linear but repeatable sensors) may be substituted for the Distance Sensors. For example, optical type, capacitive type or inductive type sensors may be used to determine the position of test head 110 relative to device handler 120. Furthermore, in place of inclinometers, angular position encoders (e.g. Allen Bradley Bulletin 845C) can be attached to any of the parts (e.g., gears, lead screws) rotated by motors 132, 212. The amount of rotation sensed by the angular position encoders can be translated into the distance of travel of test head 110 in order to determine the location of test head 110. Furthermore, the inclinometer used to measure vertical position via the angle of linkage arm structure 20b could be replaced with a variety of linear position encoders. All the substitution set forth above could be readily accomplished by one of ordinary skill in the art.

The invention has been described with the Distance Sensors externally attached to test head 110. However, one skilled in the art would readily recognize that the Distance Sensors can be incorporated into (i.e. be an integral part of) test head 110. Thus, by sufficiently miniaturizing the Distance Sensors, the Distance Sensors may be located within the periphery of test head 110. For example, the Distance Sensors may be located among contacts 14.

The invention has been described with regard to motors for accomplishing motorized motion. In alternate exemplary embodiments of the present invention, a pneumatic motor or a hydraulic motor may be used. However, one skilled in the art would readily recognize that the motor can be supplemented with a counter balance system bearing the load of the carriage base 26 with the test head 110 attached. In this manner, operator and equipment safety may be enhanced.

The invention has been described with regard to a single positioner system. However, additional positioner systems, incorporating for example support members 9 and 10, may be used adjacent to the positioner system presently illustrated in the figures.

While the invention has been described in terms of an exemplary embodiment, it is contemplated that it may be practiced as outlined above with modifications within the spirit and scope of the appended claims.

What is claimed:

1. A positioner for docking an electronic test head with a device handler, comprising:
   head rotation means for rotating said electronic test head about a first axis;
   motion means for moving said electronic test head along a second axis orthogonal to said first axis;
   sensor means for determining respective distances between a plurality of locations on at least one surface of said electronic test head and a respective plurality of locations on at least one surface of said device handler; and
   means for
   a) selectively signaling said head rotation means to rotate said electronic test head about said first axis; and
   b) selectively signaling said motion means to move said electronic test head along said second axis;
   responsive to said respective distances determined by said sensor means in order to dock said electronic test head with said device handler.

2. A positioner according to claim 1, wherein said sensor means includes a plurality of sensors, further comprising calibration means for calibrating each of said plurality of sensors to generate respective predetermined signals upon docking of said electronic test head and said device handler.

3. A positioner according to claim 2, further comprising a calibration fixture for positioning one of said first reference features and said second reference features relative to the other of said first reference features and said second reference features.

4. A positioner according to claim 1, wherein a plurality of first reference features and a plurality of second reference features are situated relative to said electronic test head and said device handler, said plurality of first reference features and said plurality of second references features engaging each other when said electronic test head is docked with said device handler.

5. A positioner according to claim 1, wherein said sensor means generates four signals identified as LVDT1, LVDT2, LVDT3 and LVDT4, each of said four signals corresponding to a respective one of said distances between said plurality of locations on said surface of said electronic test head and said respective plurality of locations.

6. A positioner according to claim 5, wherein said head rotation means rotates said electronic test head about said first axis and said motion means moves said test head along said second axis based upon pitch and roll of said electronic test head relative to said device handler wherein pitch is calculated as:

$$\text{pitch}=[(LVDT2+LVDT3)-(LVDT1+LVDT4)]/2$$

and roll is calculated as:

$$\text{roll}=[(LVDT3+LVDT4)-(LVDT1+LVDT4)]/2.$$

7. A positioner according to claim 1, further comprising a plurality of transducers each located under a respective one of said plurality of first reference features, wherein misalignment between said plurality of first reference features and said plurality of second reference features results in said transducers generating signals indicative of said misalignment.

8. A positioner according to claim 1, further comprising movement means for at least one of:
   a) moving said test head along said first axis;
   b) moving said test head about said second axis;
   c) moving said test head along a third axis orthogonal to both said first axis and said second axis; and
   d) moving said test head about said third axis.

9. A positioner according to claim 1, further comprising a calibration fixture for positioning one of said first reference features and said second reference features relative to the other of said first reference features and said second reference features.

10. A positioner according to claim 1, wherein said electronic test head and said device handler each include respective contacts, said sensor means includes a plurality of sensors, and each of said plurality of sensors are located between a respective two of said contacts on one of said electronic test head and said device handler.

11. A positioner according to claim 1, wherein said sensor means generates three signals identified as LVDT1, LVDT2 and LVDT3, each of said three signals corresponding to a respective one of said distances between said plurality of locations on said surface of said electronic test head and said respective plurality of locations.

12. A positioner according to claim 11, wherein said motion means moves said test head in a vertical direction and said head rotation means rotates said electronic test head about said first axis based upon pitch and roll of said electronic test head relative to said device handler wherein pitch is calculated as:

$$\text{pitch}=(LVDT1+LVDT2-2\times LVDT3)/2$$

and roll is calculated as:

$$\text{roll}=LVDT2-LVDT1.$$

13. A method for docking an electronic test head with a device handler, comprising the steps of:
   rotating said electronic test head about a first axis;
   moving said electronic test head along a second axis orthogonal to said first axis;

determining respective distances between a plurality of locations on at least one surface of said electronic test head and a respective plurality of locations on at least one surface of said device handler; and responsive to said respective distances determined between said plurality of locations on said at least one surface of said electronic test head and said respective plurality of locations on said at least one surface of said device handler:
- a) selectively signaling said head rotation means to rotate said electronic test head about said first axis; and
- b) selectively signaling said vertical motion means to move said electronic test head along said second axis;

in order to dock said electronic test head with said device handler.

14. A method for docking an electronic test head with a device handler according to claim 13, wherein said test head includes contacts, and a plurality of sensors are secured to at least one of said test head and said device handler for determining respective distances between said plurality of locations on said at least one surface of said test head and said respective plurality of locations on said at least one surface of said device handler, said method further comprising the steps of:

providing a calibration fixture having a planar surface;

placing said planar surface of said calibration fixture onto said contacts so that said calibration fixture extends directly above said plurality of sensors, and adjusting each of said plurality of sensors to contact said calibration fixture and generate a respective calibration signal defining docking between the test head and the device handler.

15. A method for docking an electronic test head with a device handler according to claim 13, further comprising the step of rotating said electronic test head about a third axis orthogonal to both said first axis and said second axis in order to dock said electronic test head with said device handler.

* * * * *

UNITED STATES PATENT AND TRADEMARK OFFICE
CERTIFICATE OF CORRECTION

PATENT NO.    : 6,448,797 B1
DATED         : September 10, 2002
INVENTOR(S)   : Holt et al.

It is certified that error appears in the above-identified patent and that said Letters Patent is hereby corrected as shown below:

<u>Column 4,</u>
Line 29, "test head 10" should read -- test head 110 --.

Before the DETAILED DESCRIPTION OF THE INVENTION, insert -- The entire disclosures of U.S. Patent Application No. 08/828,893 (allowed) filed on March 31, 1997, U.S. Patent Application No. 08/643,967 filed on May 7, 1996 (now U.S. Patent No. 5,900,737), U.S. Patent Application No. 08/355,501 filed on December 12, 1994 (now U.S. Patent No. 5,600,258), U.S. Patend Application No. 08/122,055 filed on September 15, 1993 (now U.S. Patent No. 5,440,943) are expressly incorporated by reference herein. --.

<u>Column 9,</u>
Line 65, "test head 10" should read -- test head 110 --.

<u>Column 10,</u>
Line 32, "manufactured by in TEST Cor-" should read -- manufactured by inTEST Cor- --.

<u>Column 11,</u>
Line 49, "Division) is used Any" should read -- Division) is used. Any --.
Line 66, "FIG. 14a shows" should read -- FIG. 13a shows --.

<u>Column 12,</u>
Lines 1 and 2, please delete "As shown in FIGS. 14b-14e," and insert thereto -- However, --.
Line 5, delete "illustrated by FIGS. 14a-14e".

<u>Column 13,</u>
Line 46, "10 are engaged" should read -- 110 are engaged --.

UNITED STATES PATENT AND TRADEMARK OFFICE
CERTIFICATE OF CORRECTION

PATENT NO.     : 6,448,797 B1
DATED          : September 10, 2002
INVENTOR(S)    : Holt et al.

It is certified that error appears in the above-identified patent and that said Letters Patent is hereby corrected as shown below:

Column 14,
Line 8, "between test head 10" should read -- between test head 110 --.

Signed and Sealed this

Eighteenth Day of March, 2003

JAMES E. ROGAN
*Director of the United States Patent and Trademark Office*